(12) United States Patent
Tan et al.

(10) Patent No.: US 12,490,460 B2
(45) Date of Patent: *Dec. 2, 2025

(54) DIELECTRIC SIDEWALL FEATURES FOR TUNING THIN FILM TRANSISTOR (TFT) PARASITICS

(71) Applicant: Intel Corporation, Santa Clara, CA (US)

(72) Inventors: Cheng Tan, Hillsboro, OR (US);
Yu-Wen Huang, Beaverton, OR (US);
Hui-Min Chuang, Hillsboro, OR (US);
Xiaojun Weng, Portland, OR (US);
Nikhil J. Mehta, Portland, OR (US);
Allen B. Gardiner, Portland, OR (US);
Shu Zhou, Portland, OR (US);
Timothy Jen, Portland, OR (US);
Abhishek Anil Sharma, Portland, OR (US); Van H. Le, Beaverton, OR (US);
Travis W. Lajoie, Forest Grove, OR (US); Bernhard Sell, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 693 days.

This patent is subject to a terminal disclaimer.

(21) Appl. No.: 17/742,631

(22) Filed: May 12, 2022

(65) Prior Publication Data

US 2023/0369501 A1 Nov. 16, 2023

(51) Int. Cl.
*H10D 30/67* (2025.01)
*H10B 12/00* (2023.01)

(52) U.S. Cl.
CPC ......... *H10D 30/6704* (2025.01); *H10B 12/05* (2023.02); *H10B 12/315* (2023.02); *H10D 30/6757* (2025.01)

(58) Field of Classification Search
CPC ........... H10D 30/6704; H10D 30/6757; H10D 30/675; H10D 30/6755; H10B 12/05; H10B 12/315

See application file for complete search history.

(56) References Cited

U.S. PATENT DOCUMENTS

2020/0098930 A1* 3/2020 Le .................. H10D 30/6743
2020/0235246 A1* 7/2020 Sharma ............ H10D 30/6713

* cited by examiner

*Primary Examiner* — Jonathan Han
(74) *Attorney, Agent, or Firm* — Finch & Maloney PLLC

(57) ABSTRACT

Techniques are provided herein for forming transistor devices with reduced parasitic capacitance, such as transistors used in a memory structure. In an example, a given memory structure includes memory cells, with a given memory cell having an access device and a storage device. The access device may include, for example, a thin film transistor (TFT), and the storage device may include a capacitor. Any of the given TFTs may include a dielectric liner extending along sidewalls of the TFT. The TFT includes a recess (e.g., a dimple) that extends laterally inwards toward a midpoint of a semiconductor region of the TFT. The dielectric liner thus also pinches or otherwise extends inward. This pinched-in dielectric liner may reduce parasitic capacitance between the contacts of the TFT and the gate electrode of the TFT. The pinched-in dielectric liner may also protect the contacts from forming too deep into the semiconductor region.

20 Claims, 18 Drawing Sheets

DIELECTRIC SIDEWALL FEATURES FOR TUNING THIN FILM TRANSISTOR (TFT) PARASITICS

FIELD OF THE DISCLOSURE

The present disclosure relates to integrated circuits, and more particularly, to tuning thin film transistor parasitics.

BACKGROUND

As integrated circuits continue to scale downward in size, a number of challenges arise. For instance, as transistor area decreases, so too do the dimensions for interconnects made to the various transistor structures, such as gate structures, drain regions, and source regions. Structures formed in such interconnect layers may be more susceptible to parasitic effects, such as capacitance, as they become more densely packed, and the features of any given structure become closer together or otherwise tightly integrated. Accordingly, there remain a number of non-trivial challenges with respect to the formation of backend structures in integrated circuits.

Figure 1A:
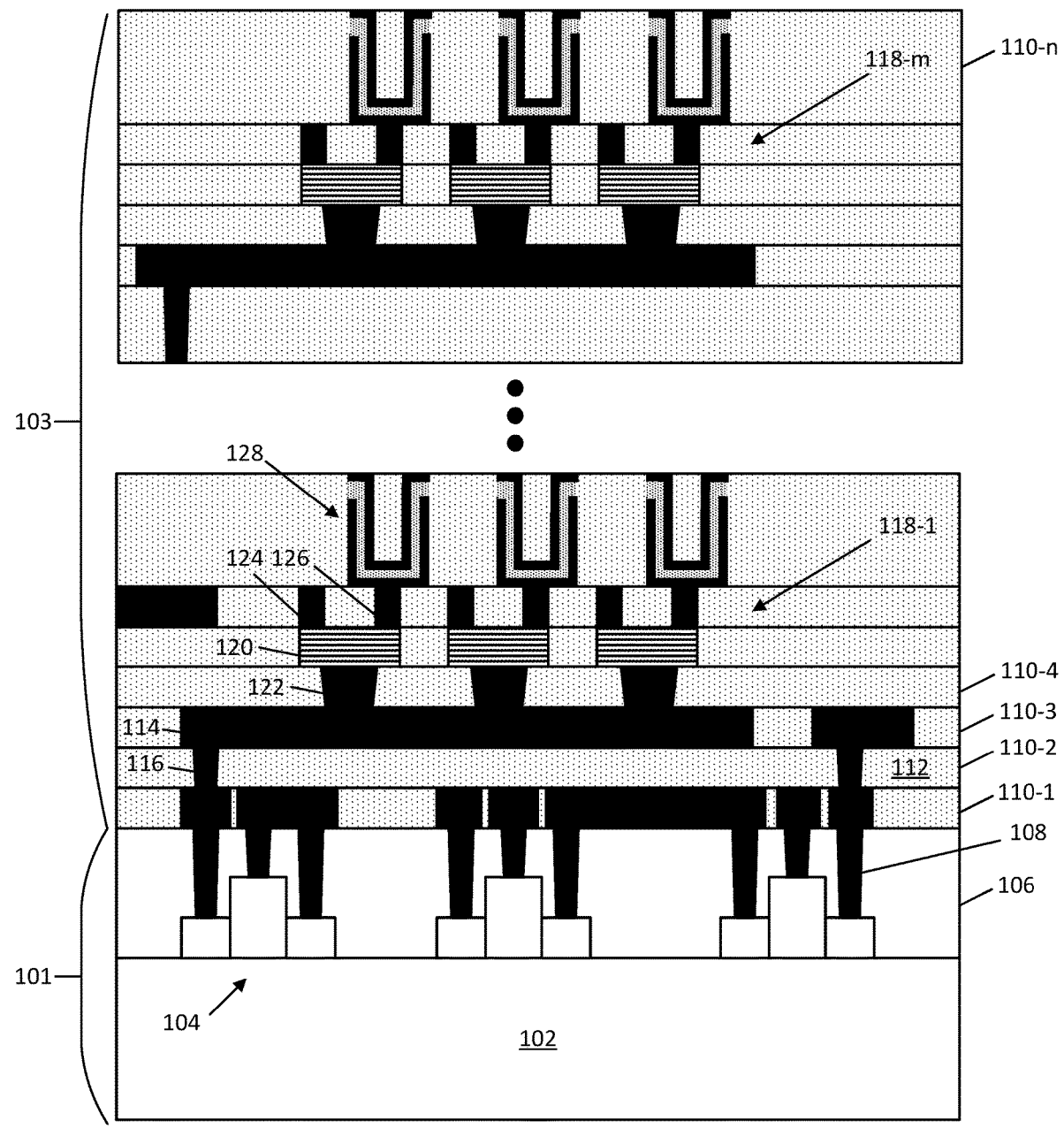
FIG. 1A is a cross-sectional view that illustrates an example portion of an integrated circuit configured with an interconnect region having tiers of memory structures over a plurality of semiconductor devices, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein for making different transistor sidewall profiles to tune device parasitics such as capacitance. The techniques can be used in any number of applications, but are particularly well-suited to forming backend (e.g., within the interconnect region) memory structures in which the access transistor device is configured with indented sidewall features to reduce parasitic capacitance. According to some examples, a given memory structure generally includes memory cells, with each memory cell having an access device and a storage device, so as to provide a 1T-1C cell configuration. The access device may include, for example, a thin film transistor (TFT) structure, and the storage device may include a capacitor. In such cases, the TFT structure allows the capacitor to be accessed during write operations (to store a memory bit) and read operations (to read a previously-stored bit). According to some such embodiments, the memory structures are arranged in a two-dimensional array within one or more interconnect layers and stacked in a vertical direction such that multiple tiers of memory structure arrays are formed within the interconnect region. Any of the given TFT structures may include a dielectric liner extending along sidewalls of the various layers in the TFT structure that includes an indentation (e.g., a dimple) that pinches inwards into a semiconductor region (sometimes called channel layer or channel region) of the TFT structure. This dielectric indentation from the sidewall may be formed to reduce parasitic capacitance between the contacts of the TFT structure and the gate electrode of the TFT structure. The indentation features may also protect the contacts from forming too deep into the semiconductor region of the TFT structure. In some example cases, the dielectric indentation is formed by accessing dead-space adjacent to the TFT structure, thus allowing a lateral etch into the side of the TFT structure. The etch can be selective, such that only the channel layer of the TFT structure is etched while other exposed materials remain intact or otherwise relatively unetched. The dielectric liner (e.g., encapsulation layer) can then be conformally deposited along that sidewall, and thus extends into the now-dimpled channel layer. Numerous variations and embodiments will be apparent in light of this disclosure.

General Overview

As previously noted above, there are a number of non-trivial challenges with respect to forming backend structures within a given interconnect region of an integrated circuit. For example, TFT-based memory structures often have various conductive features or layers that can create unwanted parasitic capacitance leading to signal delays and slower access times. As a result, memory performance can suffer if the parasitic capacitance is not reduced. In addition, for patterning schemes that do not have self-aligned features, the patterning and etch must have built-in margin to account for edge-placement error and etch bias that are typical of any process integration flow. For such schemes that have built-in margins, this area is typically a non-useable area (wasted space). One possible solution to such issues is to pattern separate and different critical dimension (CD) targets. However, such patterning of different CD targets requires many masks and can lead to issues at etch time (e.g., defects) because the exposed area density is different for each CD target. To this end, it can be a very long, tedious and expensive process to retune an entire process flow around a CD target change.

Thus, and in accordance with some embodiments of the present disclosure, techniques are provided herein to form a backend memory structure having an indented or dimpled dielectric sidewall feature. The backend memory structure may be one memory structure of an array of similar memory structures formed within various levels of interconnect layers over semiconductor devices (e.g., transistors) of a previously-formed device layer. Any kind of memory structure configuration can be used, such as those that employ thin film transistor (TFT) structures coupled with capacitor structures formed in the interconnect layers, to provide dynamic random-access memory (DRAM). According to some embodiments, a TFT structure includes a gate electrode, a gate dielectric over the gate electrode (for a backside gate configuration), a semiconductor or so-called channel region over the gate dielectric, and one or more contacts to the semiconductor region that act as source or drain regions for the transistor. Furthermore, in some embodiments, a dielectric liner (e.g., encapsulation layer) extends along a sidewall of at least the gate electrode, gate dielectric, and the semiconductor region. The dielectric liner pinches inwards at the semiconductor region forming a dimple or indentation feature. According to some embodiments, this sidewall indentation or dimple feature is formed before forming the one or more contacts, such that the effective area at the bottom surface of the contact is decreased. Decreasing the area between the contact and the underlying gate electrode reduces parasitic capacitance. In some cases, the dielectric indentation is formed by accessing dead-space adjacent to the transistor structure, thus allowing a lateral etch into the side of the transistor structure. The etch can be selective, such that only the channel layer of the transistor structure is etched while other exposed materials remain intact or otherwise relatively unetched. The dielectric liner can then be conformally deposited along that sidewall, and thus extends into the now-dimpled channel layer.

According to an embodiment, an integrated circuit includes a gate electrode, a gate dielectric on the gate electrode, a semiconductor region on the gate dielectric, a conductive contact that contacts at least a portion of the semiconductor region, and a dielectric liner that extends along a sidewall of at least the gate electrode, the gate dielectric, and the semiconductor region. A portion of the dielectric liner on the sidewall of the semiconductor region pinches inwards.

According to an embodiment, an integrated circuit includes a plurality of semiconductor devices, an interconnect structure above the plurality of semiconductor devices and including a plurality of interconnect layers, and a thin film transistor (TFT) structure within an interconnect layer of the plurality of stacked interconnect layers. The TFT structure includes a gate electrode, a gate dielectric on the gate electrode, a semiconductor region on the gate dielectric, a conductive contact that contacts at least a portion of the semiconductor region, and a dielectric liner that extends along a sidewall of at least the gate electrode, the gate dielectric, and the semiconductor region. A portion of the dielectric liner on the sidewall of the semiconductor region pinches inwards as can be seen in a cross-sectional profile. In particular, a portion of the dielectric liner on the sidewall of the semiconductor region laterally extends inwards towards a midpoint of the semiconductor region.

According to another embodiment, an integrated circuit includes a plurality of semiconductor devices, an interconnect region above the plurality of semiconductor devices and having a plurality of stacked interconnect layers, and a thin film transistor (TFT) structure within an interconnect layer of the plurality of stacked interconnect layers. The TFT structure includes a gate electrode, a gate dielectric on the gate electrode, a semiconductor region on the gate dielectric and having a lateral recess along a sidewall of the semiconductor region, a dielectric liner that extends along a sidewall of at least the gate electrode, the gate dielectric, and the semiconductor region, such that a portion of the dielectric liner is within the lateral recess of the semiconductor region, and a conductive contact that contacts at least a portion of a top surface of the semiconductor region and at least a portion of the portion of the dielectric liner within the lateral recess.

According to another embodiment, a method of forming an integrated circuit includes forming a gate electrode on an underlying interconnect layer within an interconnect region over a plurality of semiconductor devices; forming a gate dielectric on the gate electrode; forming a semiconductor region on the gate dielectric; forming one or more dielectric layers over the semiconductor region; etching a first recess through a thickness of the one or more dielectric layers, the semiconductor region, the gate dielectric, and the gate electrode; laterally etching an exposed sidewall of the semiconductor region to form a lateral recess at the semiconductor region; forming a dielectric liner within the first recess and over at least the exposed sidewall of the semiconductor region, such that the dielectric liner forms within the lateral recess; etching a second recess through the one or more dielectric layers such that the second recess exposes at least a portion of a top surface of the semiconductor region; and forming a conductive contact within the second recess.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of a lateral dimple or indentation along the sidewall of the semiconductor region of a TFT structure. Furthermore, a dielectric liner may be observed along the sidewalls of various material layers of the TFT structure and within the lateral dimple or indentation along the sidewall of the semiconductor region. In some other examples, an edge of a conductive contact may directly land upon a portion of the dielectric liner where it pinches inwards.

It should be readily understood that the meaning of "above" and "over" in the present disclosure should be interpreted in the broadest manner such that "above" and "over" not only mean "directly on" something but also include the meaning of over something with an intermediate feature or a layer therebetween. The meaning of "on" or "directly on" in the present disclosure should be interpreted to mean something that is on something else with no intermediate feature or layer therebetween. Further, spatially relative terms, such as "beneath," "below," "lower," "above," "upper," "top," "bottom," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The integrated circuit or structure may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer. Example layers include, for instance, a liner or barrier layer (e.g., a relatively thin layer of tantalum nitride), an etch stop layer (e.g., a relatively thin layer of silicon nitride), an interconnect layer (e.g., a relatively thick layer that includes dielectric material and one or more conductive interconnect features and/or active devices and/or passive devices), and a device layer (e.g., a relatively thick layer that includes metal oxide semiconductor field effect transistors or MOSFETs along with dielectric materials and conductive materials)

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Architecture

FIG. 1A is a cross-sectional view that illustrates an example portion of an integrated circuit having an interconnect region 103 above a device region 101 that includes a plurality of semiconductor devices 104, in accordance with an embodiment of the present disclosure. The semiconductor devices 104 in this example are non-planar metal oxide semiconductor (MOS) transistors, such as tri-gate or gate-all-around (GAA) transistors, although other transistor topologies and types can also benefit from the techniques provided herein, as will be appreciated (e.g., planar transistors, thin film transistors, or any other transistors to which contact can be made). The semiconductor devices 104 may be configured for any number of functions, such as logic or compute transistors, input/output (I/O) transistors, access or switching transistors, and/or radio frequency (RF) transistors, to name a few examples.

According to some embodiments, in addition to semiconductor devices 104, device region 101 may include, for example, one or more other layers or structures associated with the semiconductor devices 104. For example, device region 101 can also include a substrate 102 and one or more dielectric layers 106 that surround active and/or conductive portions of the semiconductor devices 104. Device region 101 may also include one or more conductive contacts 108 that provide electrical contact to transistor elements such as gate structures, drain regions, or source regions. Conductive contacts 108 may include, for example, tungsten, ruthenium, or copper, although other metal or metal alloy materials may be used as well. Some embodiments may include a local interconnect (e.g., via or line) that connects a given contact 108 to an interconnect feature within the interconnect region 103.

Substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material from and/or upon which transistors can be formed. Alternatively, the substrate can be a semiconductor-on-insulator substrate having a desired semiconductor layer over a buried insulator layer (e.g., silicon over silicon dioxide). Alternatively, the substrate can be a multilayer substrate or superlattice suitable for forming nanowires or nanoribbons (e.g., alternating layers of silicon and SiGe, or alternating layers indium gallium arsenide and indium phosphide). Any number of substrates can be used. In some embodiments, backside processing is used to remove substrate 102 and form additional backside interconnect layers. The techniques provided herein may be used to provide multi-tier memory structures within frontside and/or backside interconnect structures, as will be appreciated.

Interconnect region 103 includes any number (n) of interconnect layers 110-1 to 110-$n$ stacked over one another. Each interconnect layer can include a dielectric material 112 along with one or more different conductive interconnect features (e.g., vias and lines), active devices (e.g., transistors, diodes), and/or passive devices (e.g., capacitors, resistors, inductors). Dielectric material 112 can be any dielectric, such as silicon oxide, silicon oxycarbide, silicon nitride, or silicon oxynitride. Dielectric material 112 may be formed using any known dielectric deposition technique such as chemical vapor deposition (CVD), plasma-enhanced chemical vapor deposition (PECVD), flowable CVD, spin-on dielectric, or atomic layer deposition (ALD). The one or more conductive interconnect features can include any number of conductive traces 114 and conductive vias 116 arranged in any pattern across the interconnect layers 110-1 to 110-$n$ to carry signal and/or power voltages to/from the various semiconductor devices 104. As used herein, conducive vias, such as conductive via 116, extend at least partially through an interconnect layer to connect between conductive traces on an upper interconnect layer and/or a lower interconnect layer, while conductive contacts, such as conductive contact 108, extend at least partially through a portion of dielectric layer 106 or any interconnect layer to contact one or more transistor elements. Interconnect layers are sometimes called metallization layers (e.g., such as M0 through M15). In some embodiments, a given metallization layer may include two adjacent interconnect layers with vias in one of the layers and metal traces in the other of the two layers.

Any of conductive traces 114 and conductive vias 116 can include any number of conductive materials, with some examples including copper, ruthenium, tungsten, cobalt, molybdenum, titanium, tantalum, and alloys thereof. In some example cases, any of conductive traces 114 and conductive vias 116 include a relatively thin liner or barrier, such as manganese, ruthenium, titanium nitride, titanium silicide, tungsten carbo-nitride (WCN), physical vapor deposited (PVD) or ALD tungsten, tantalum, or tantalum nitride, to name a few examples.

Note that each of the various conductive vias 116 and conductive contacts 108 are shown with tapered profiles to indicate a more natural appearance due to the etching process used to form the openings, although such tapering may not always be present. Any degree of tapering may be observed depending on the etch parameters used and the thickness of the dielectric layer being etched through. Furthermore, conductive vias may be stacked one over the other through different dielectric layers of interconnect region 103. However, in some examples, a single via recess may be formed through more than one dielectric layer yielding a taller, more tapered conductive via that extends through two or more dielectric layers (e.g., a deep via or supervia).

As can be further seen in this example embodiment, interconnect region 103 also includes tiers of memory arrays 118-1-118m, with each of the m memory arrays having any number of backend memory structures and/or capacitors. Each of the memory arrays may extend vertically across any number of interconnect layers (e.g., one, two or many). In some embodiments, a given memory array 118-1 includes a plurality of TFT structures 120 formed over a given conductive trace, such as conductive trace 114, extending in a first direction. According to some embodiments, a conductive via 122 extends between each TFT structure 120 along the illustrated row of TFT structures and conductive trace 114. In some other embodiments, the TFT structures 120 along the same row sit directly on conductive trace 114.

One or more second conductive traces 124 may each couple to a corresponding contact of a given TFT structure 120. Second conductive traces 124 may extend in a second direction orthogonal to the first direction. Conductive trace 114 may be, for example, a wordline of several parallel wordlines that extend beneath any number of TFT structures 120. Second conductive traces 124 may represent, for example, parallel bitlines extending into and out of the page and each connecting to the contacts of any number of TFT structures 120. TFT structures 120 can include any number of layers to form a transistor with a first source or drain region coupled to a corresponding second conductive trace 124 and a second source or drain region coupled to a conductive via 126. According to some embodiments, conductive via 126 acts as a conductive bridge between the second source or drain contact of a given TFT structure 120 and an electrode of its associated capacitor 128. Capacitors 128 may be, for example, metal-insulator-metal (MIM) capacitors having a U-shaped cross-section as shown, although other capacitor structures may be used as well (e.g., pillar-based capacitors with a dielectric layer sandwiched between an inner conductive core and an outer conductive layer, flat capacitors with a dielectric layer sandwiched between upper and lower conductive layers or between left and right conductive layers). Each capacitor 128 in tandem with its associated TFT structure 120 represents a single TFT memory structure or memory cell for holding a single bit (e.g., a logic zero or one depending on the charge state of capacitor 128). This example shows TFT structure 120 contained within a single interconnect layer, but other embodiments may have TFT structures that extend vertically through two or more such interconnect layers. Further note that, in some embodiments, there is a relatively thin etch stop layer between adjacent interconnect layers, such as between any adjacent interconnect layers 110. Such etch stops may have a thickness in the range of, for example, 2 nm to 10 nm, and may include, for instance, silicon nitride, silicon oxynitride, or silicon oxycarbonitride, to name few examples.

As discussed above, the TFT structures 120 can suffer from parasitic capacitance due to the close proximity of certain conductive features. According to some embodiments, any given TFT structure 120 can include a dielectric liner along sidewalls of the various layers that has a dimple or indentation feature that can reduce the parasitic capacitance. Further details of the fabrication process for a single TFT memory structure, including the formation of the dimple or indentation feature, are provided herein with respect to FIGS. 2A-2K.

Figure 1B:
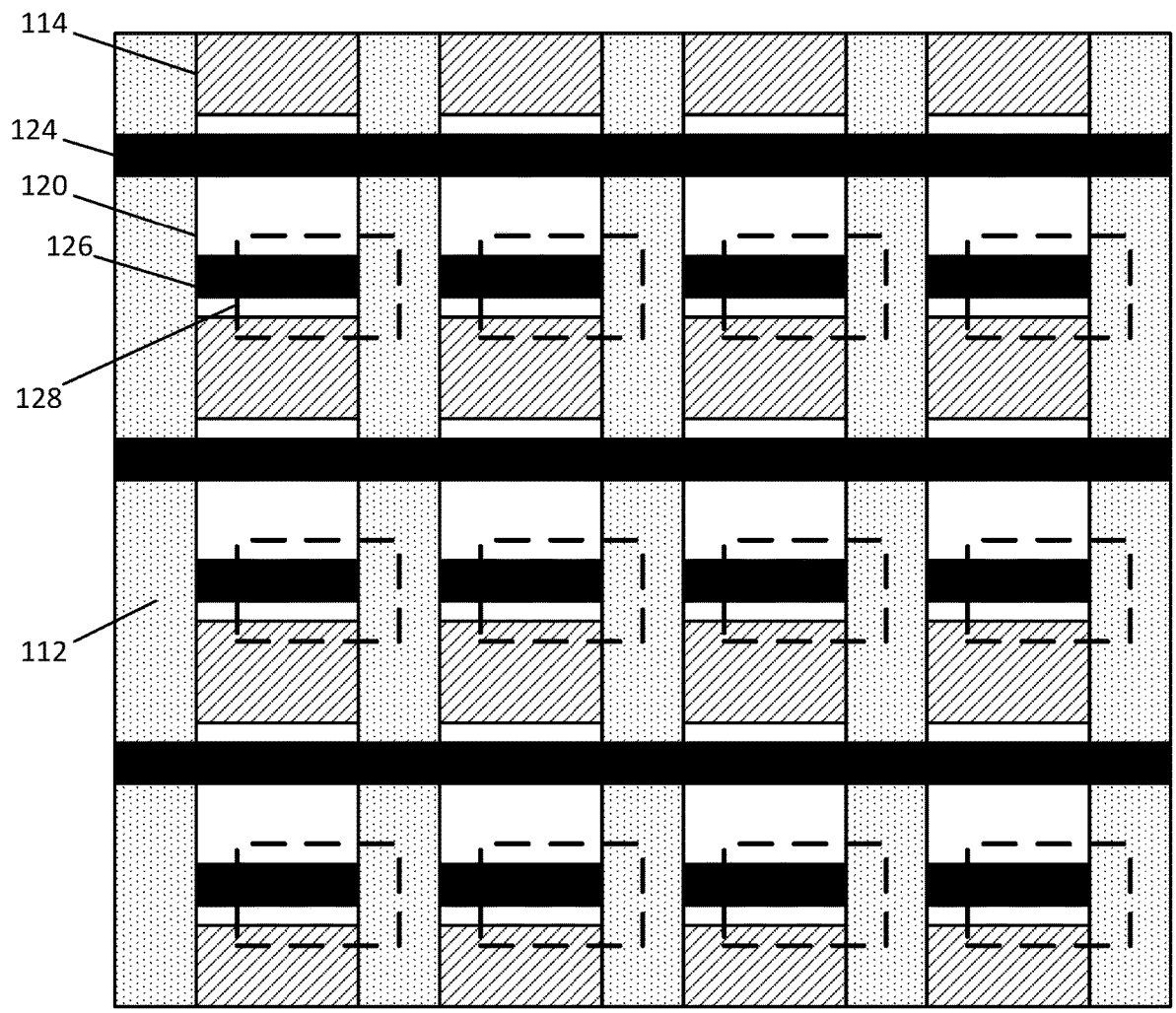
FIG. 1B is a plan view of an array of memory structures and generally illustrates structures formed across different interconnect layers, in accordance with an embodiment of the present disclosure.

FIG. 1B illustrates a plan view across an array of TFT memory structures, according to an embodiment. Many of the illustrated structures are located on or across different interconnect layers as shown in FIG. 1A but are all shown together in a single view in FIG. 1B for clarity. A plurality of parallel conductive traces 114 are present within a first interconnect layer and surrounded by dielectric material 112 within the first interconnect layer. Note in this view that the conductive traces 114 each run from the top to the bottom of the page (or vice-versa). According to some embodiments, dielectric material 112 is also present between any other structures on other interconnect layers, such as between adjacent TFT structures 120 and/or between adjacent capacitors 128.

TFT structures 120 are formed as individual islands in an array across the plurality of conductive traces 114, according to some embodiments. In this way, conductive traces 114 act as wordlines with each conductive trace 114 coupled to the gate(s) of one or more TFT structures 120 arranged along its length. In this example view, there are four conductive traces 114 shown, and there are three TFT structures 120 along the length of each conductive trace 114.

According to some embodiments, one of the source or drain contacts of TFT structures 120 in a same row are coupled to a same second conductive trace 124 that extends in a different direction (e.g., orthogonally) compared to conductive trace 114. A plurality of parallel second conductive traces 124 may each extend across any number of TFT structures and be coupled to the source or drain contact on each of the TFT structures in the row. In this example view, there are three conductive traces 124 shown, and there are four TFT structures 120 along the length of each conductive trace 124. Accordingly, any given TFT structure 120 of the array has its gate coupled to one of the conductive traces 114 (e.g., wordline) and one of its source or drain contacts coupled to one of the second conductive traces 124 (e.g., bitline) such that each of the TFT structures are individually addressable, in some examples. The other source or drain contact on each TFT structure 120 is coupled to its own conductive via 126, which acts like a conductive bridge between the TFT structure 120 and its corresponding capacitor 128. In an embodiment, TFT structures 120 are formed in a second interconnect layer over the first interconnect layer, second conductive traces 124 and conductive vias 126 are formed in a third interconnect layer over the second interconnect layer, and capacitors 128 are formed in a fourth interconnect layer over the third interconnect layer. In some other embodiments, note that one or more of TFT structures 120 may be a dummy structure (e.g., not connected into a working memory cell or otherwise non-functional).

Fabrication Methodology

FIGS. 2A-2K are cross-sectional views that collectively illustrate an example process for forming a portion of an interconnect region of an integrated circuit. According to an embodiment, the fabrication process for forming a 1T-1C memory structure in the interconnect region is provided. Each figure shows an example structure that results from the process flow up to that point in time, so the depicted structure evolves as the process flow continues, culminating in the structure shown in FIG. 2K, which provides a detailed view of a single example TFT memory structure. The TFT memory structure may be one structure of a plurality of TFT memory structures across an array of memory structures (e.g., a single tier of memory structures). Each structure in the array may be formed together using the processes detailed here. Furthermore, as noted above, multiple tiers of memory arrays may be formed in the interconnect region. The TFT memory structures of each tier may be formed using the same general processes discussed here.

The TFT memory structure may be part of an overall integrated circuit (e.g., such as a processor or memory chip, or a system-on-chip) that includes, for example, digital logic cells and/or memory cells and analog mixed signal circuitry. Example materials and process parameters are given, but other materials or parameters will be appreciated in light of this disclosure.

Figure 2A:
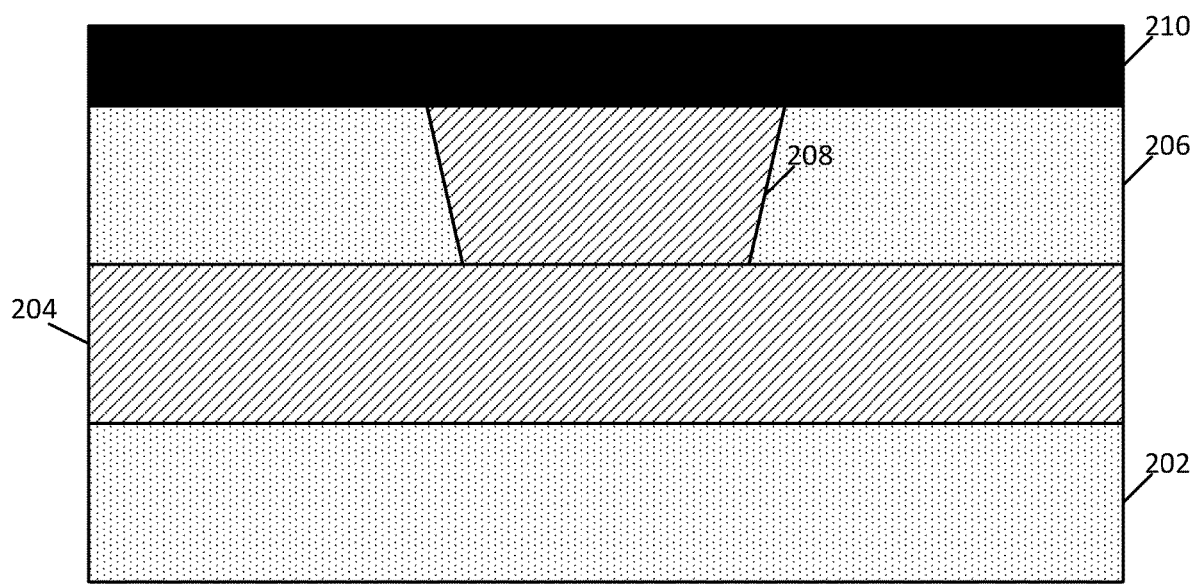
FIGS. 2A-2K are cross-sectional views that collectively illustrate an example process for forming a thin film transistor (TFT) of a memory structure and having an indented sidewall feature, in accordance with an embodiment of the present disclosure.

FIG. 2A is a cross-sectional view taken through some interconnect layers of a plurality of stacked interconnect layers. Accordingly, any number of lower interconnect layers 202 may be at any position within interconnect region 103. Interconnect layers 202 may include any conductive traces and/or vias within any number of dielectric layers. According to some embodiments, a first interconnect layer includes a first conductive trace 204. As discussed above, first conductive trace 204 may be one wordline of a plurality of wordlines that run parallel to one another in the first interconnect layer. Other memory control/access schemes can be used as well.

First conductive trace 204 may be formed, for example, by first forming a recess within a surrounding dielectric layer (not shown) followed by filling the recess with a conductive material, such as copper, that is deposited using any one of electroplating, electroless plating, CVD, or PECVD, to name a few examples. After deposition of the conductive material within the recess, a polishing process may be performed using, for example, chemical mechanical polishing (CMP) to planarize the given layer down to a top surface of first conductive trace 204. In some embodiments, a thin barrier layer is conformally deposited (e.g., via ALD or CVD) first along the inner surfaces of the recess prior to the deposition of the copper or other conductive fill material. The thin barrier layer may include, for example, tantalum or titanium, or a nitride of these, or some other electromigration inhibitor.

According to some embodiments, another dielectric layer 206 is deposited over first conductive trace 204, and a conductive via 208 is formed within dielectric layer 206 such that conductive via 208 is on first conductive trace 204. In some embodiments, conductive via 208 is one via of a plurality of such conductive vias formed within dielectric layer 206 along a length of first conductive trace 204 and along a length of other such conductive traces parallel to first conductive trace 204.

According to some embodiments, a gate electrode 210 is deposited on dielectric layer 206 and a top surface of conductive via 208. In some other embodiments, dielectric layer 206 is omitted such that gate electrode 210 is deposited directly on first conductive trace 204. In either case, gate electrode 210 is conductively coupled to first conductive trace 204 (either directly or through conductive via 208). As will be appreciated, this particular example refers to a backside-gate configuration, where the gate structure of the access device being formed is on a backside of the device, and the source and drain contacts of that device are on a frontside of the device. Such a configuration facilitates connectivity within a given memory array (e.g., sandwiching a TFT device between a wordline and a bitline), but other connectivity schemes may be used if device density constraints allow for same.

Gate electrode 210 may include any suitable conductive material such as polysilicon, a metal, or a metal alloy. Example suitable metals or metal alloys include aluminum, tungsten, cobalt, molybdenum, ruthenium, titanium, tantalum, copper, and carbides and nitrides thereof. Note that gate electrode 210 may contain multiple layers, such as an inner plug or fill metal, with surrounding or outer work function material. According to some embodiments, gate electrode 210 includes one or more n-type work function metals such as platinum, gold, palladium, or cobalt. In some embodiments, gate electrode 210 includes one or more p-type work function metals such as titanium, titanium nitride, tantalum, or tantalum nitride.

Figure 2B:
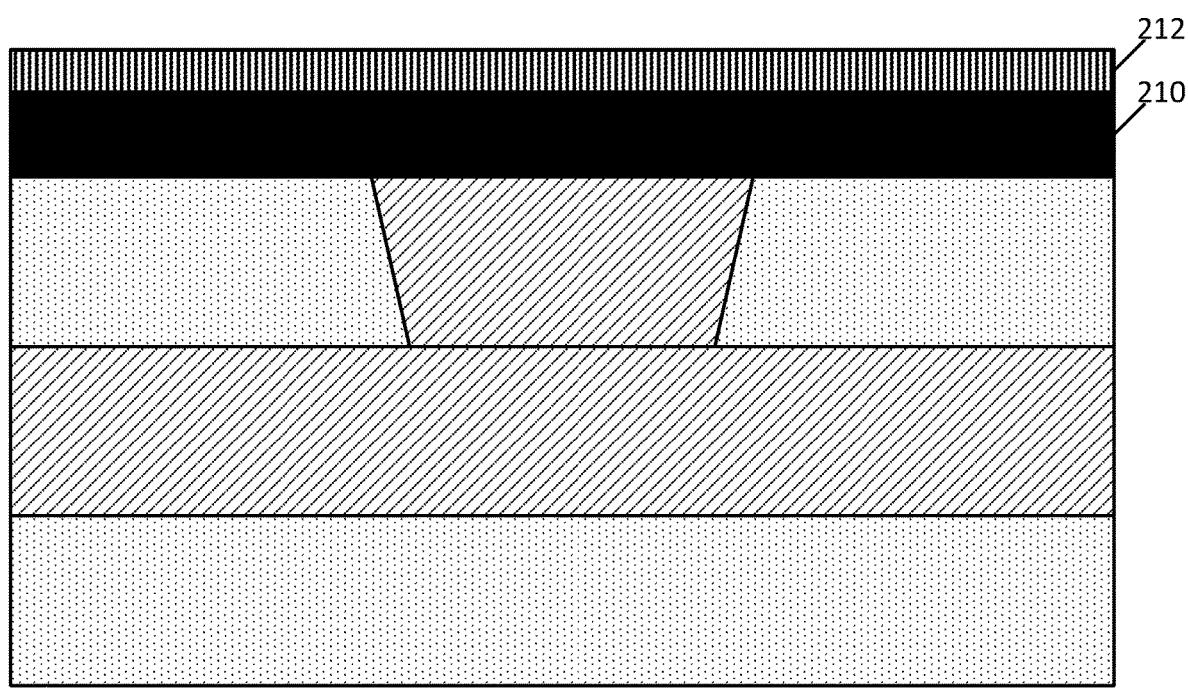

FIG. 2B is a cross-sectional view of the structure depicted in FIG. 2A after formation of a gate dielectric 212 over gate electrode 210. Gate dielectric 212 may be deposited, for example, to a thickness between about 2 nm and about 10. In some embodiments, gate dielectric 212 has a thickness up to about 50 nm. Gate dielectric 212 may include any suitable dielectric material (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, and lead scandium tantalum oxide. In some cases, gate dielectric 212 may include multiple layers, such as a first layer of high-k material (e.g., hafnium oxide) on the gate electrode 210 and a second layer of lower-k oxide between the first layer and the channel layer that is ultimately formed over gate dielectric 212. The lower-k oxide may be, for instance, silicon oxide or an oxide of the channel layer material. Gate dielectric 212 may have a thickness between about 1 nm and about 10 nm.

Figure 2C:
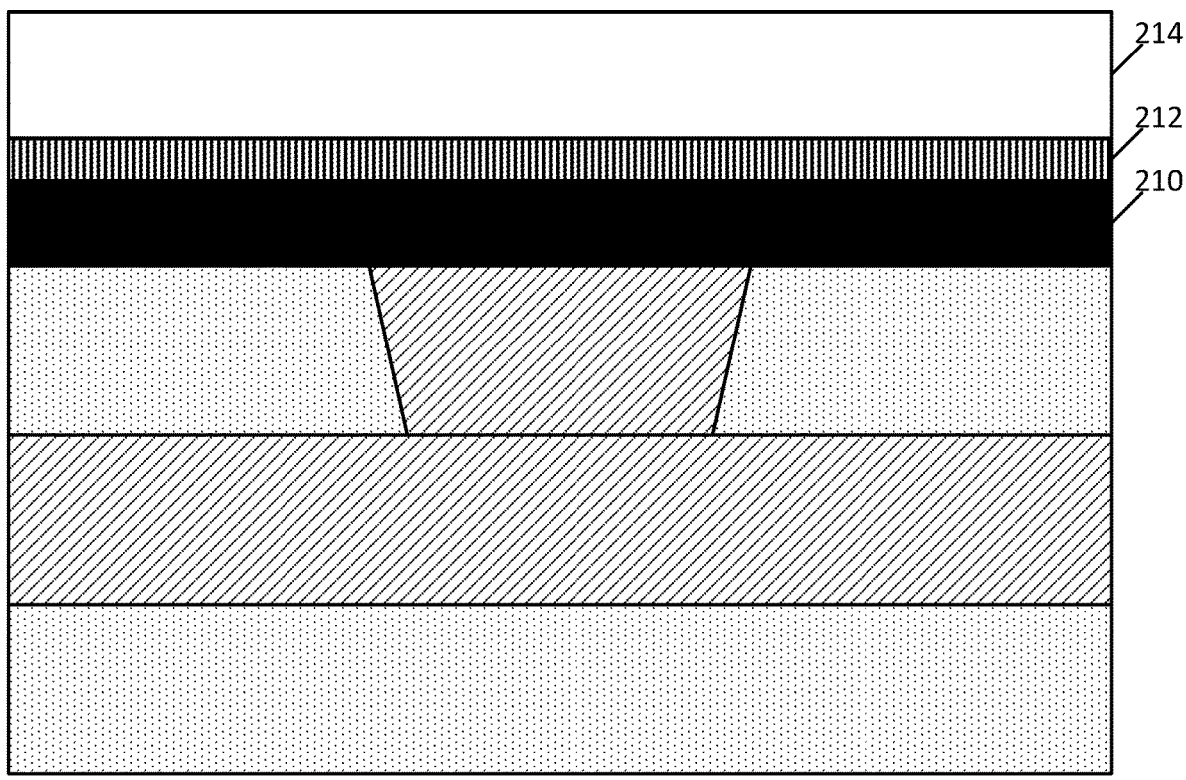

FIG. 2C is a cross-sectional view of the structure depicted in FIG. 2B after the formation of a semiconductor region 214 (also referred to as a channel layer or channel region) over gate dielectric 212. Semiconductor region 214 may include any suitable semiconductor material, such as silicon or any III-V or II-VI materials exhibiting semiconducting qualities. According to some embodiments, semiconductor region 214 includes any of indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$ (silicon-boron-nitrogen), stanene, phosphorene, molybdenite, poly-III-V like indium arsenide (InAs), indium gallium arsenide (InGaAs), indium phosphide (InP), amorphous indium gallium zinc oxide (InGaZnO, sometimes referred to as a-IGZO), crystal-like InGaZnO (sometimes referred to as c-IGZO), gallium zinc oxynitride (GaZnON), zinc oxynitride (ZnON), molybdenum and sulfur, a group-VI transition metal dichalcogenide, or a c-axis aligned crystal (CAAC) layer. Semiconductor region 214 may have a thickness between about 4 nm and about 16 nm. According to some embodiments, semiconductor region 214 includes a plurality of deposited semiconductor layers with each layer having a different material composition and/or doping profile.

Figure 2D:
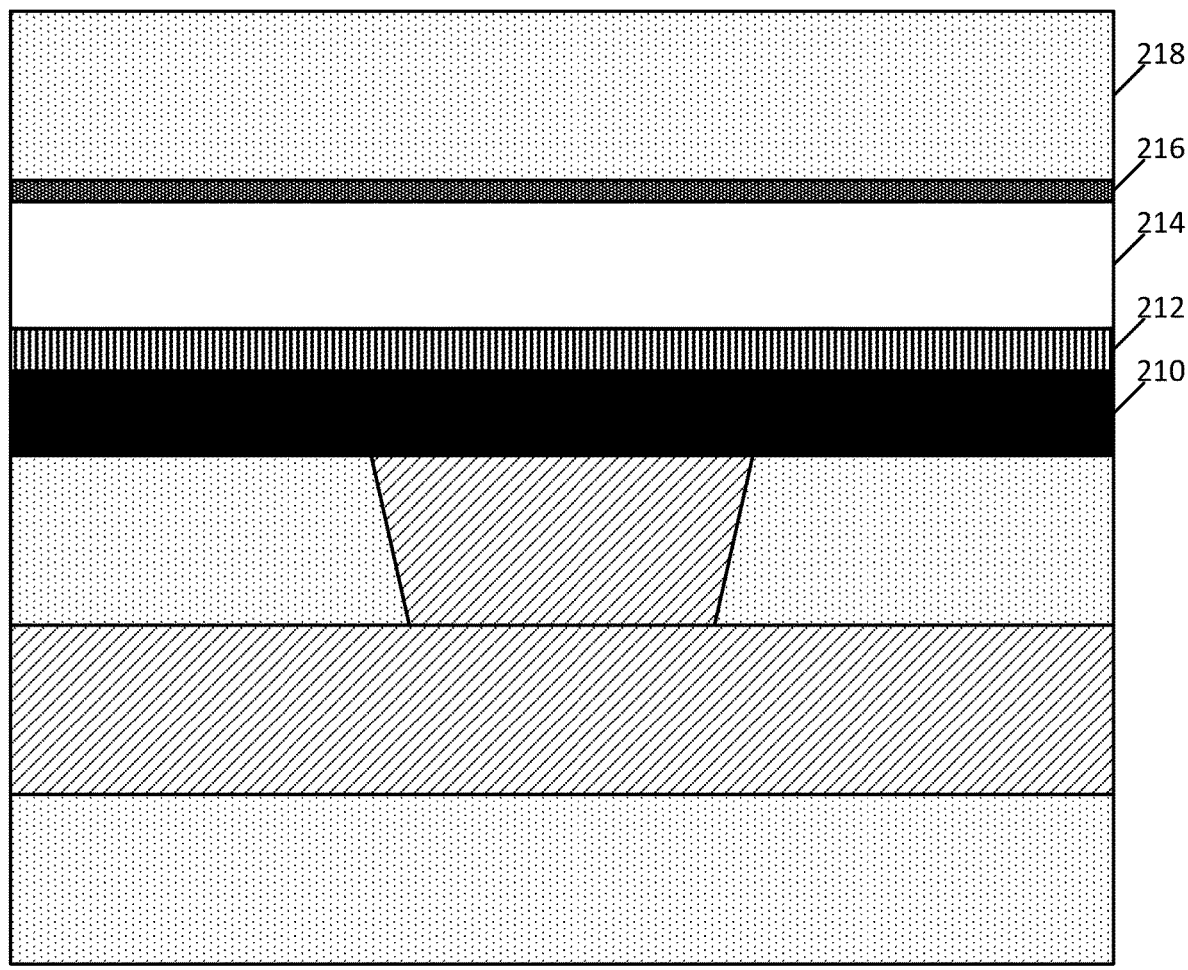

FIG. 2D is a cross-sectional view of the structure depicted in FIG. 2C after forming a passivation layer 216 and dielectric layer(s) 218. According to some embodiments, passivation layer 216 includes a dielectric material that protects the underlying semiconductor region 214. Passivation layer 216 may include, for example, aluminum oxide, although other metal oxides may be used as well. Dielectric layer(s) 218 represent any number of passivation and/or interlayer dielectrics (ILD) deposited over passivation layer 216. According to some embodiments, dielectric layer(s) 218 include the same material composition as dielectric material 112 in any interconnect layer. Dielectric layer(s) 218 may include, for instance, silicon oxide, silicon oxycarbide, silicon nitride, or silicon oxynitride, to name a few examples.

Figure 2E:
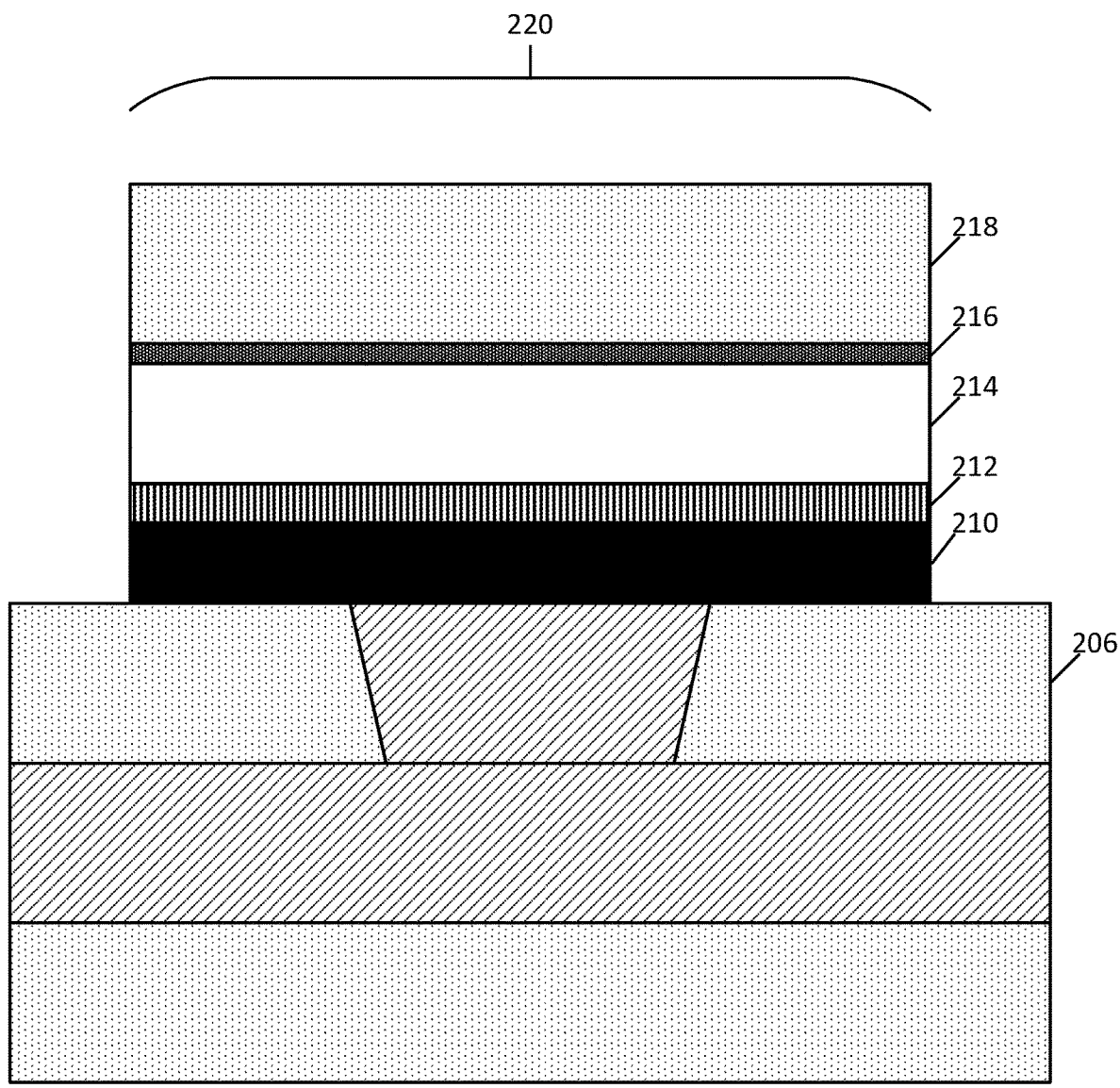

FIG. 2E is a cross-sectional view of the structure depicted in FIG. 2D after an etching process is performed to form an individual island of TFT layers 220. According to some embodiments, the etching process simultaneously forms multiple islands of TFT layers across any number of first conductive traces. An anisotropic etch may be performed to cut through a thickness of each of gate electrode 210, gate dielectric 212, semiconductor region 214, passivation layer 216, and dielectric layer(s) 218. In some embodiments, the etching process stops at a top surface of dielectric layer 206 or may stop after etching through a portion of dielectric layer 206. According to some embodiments, the etch depth at least cuts through an entire thickness of gate electrode 210. The full length of the resulting island of TFT layers 220 can vary from one embodiment to the next, but in some examples may be between about 50 nm and about 250 nm. In some embodiments, the distance between adjacent TFT layers 220 along a common first conductive trace 204 is between about 10 nm and about 50 nm. Note that the removed materials to any side of a given island 220 effectively provide unused or dead-space that can be used in an advantageous manner as variously provided herein (to provide a dimpled dielectric liner), according to some embodiments.

Figure 2F:
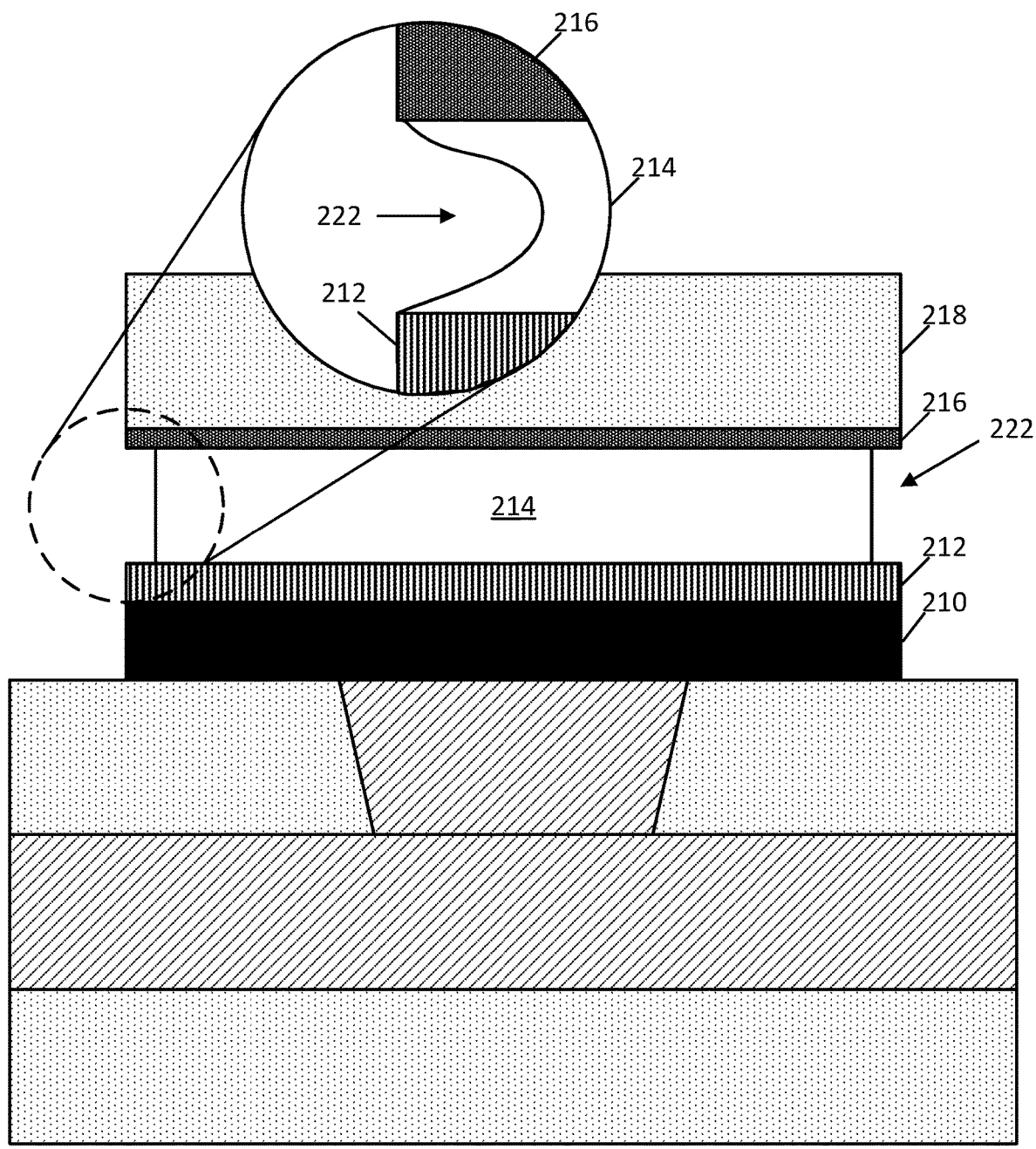

FIG. 2F is a cross-sectional view of the structure depicted in FIG. 2E following lateral etching of the exposed sidewalls of semiconductor region 214. An isotropic etching process using either wet chemical etchants or dry plasma may be used to selectively remove the exposed portions of semiconductor region 214 to form a lateral recess, while simultaneously removing none of (or very little of) the surrounding dielectric and/or metal materials. The etching process may form a divot 222 as illustrated in the expanded drawing where the center of semiconductor region 214 etches slightly faster than the edges. In some embodiments, divot 222 extends laterally into semiconductor region 214 between about 0.5 nm and about 15 nm (e.g., 0.5 to 10 nm, or 0.5 to 5 nm). Note that, in some embodiments, divot 222 is formed only within a central portion of semiconductor region 214 such that the opening does not extend to either or both the top and bottom edges of semiconductor region 214.

Figure 2G:
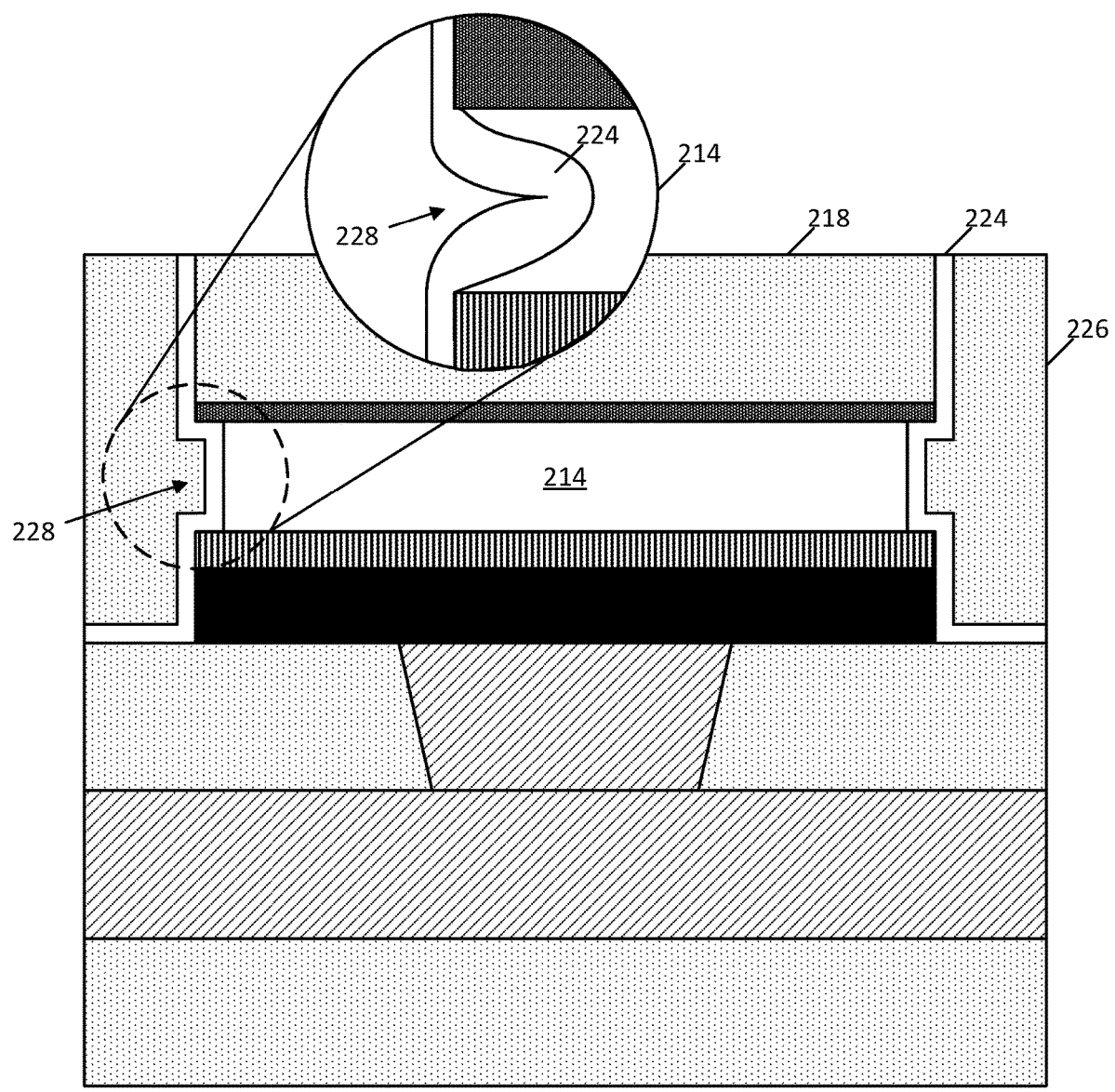

FIG. 2G is a cross-sectional view of the structure depicted in FIG. 2F following the formation of filler dielectric layers between adjacent islands of TFT layers 220, according to some embodiments. A dielectric liner 224 may be deposited over the sidewalls of TFT layers 220. According to some embodiments, dielectric liner 224 is a high-k material, such as hafnium oxide, with a thickness between about 0.5 nm and 5 nm (e.g., 0.5 to 3 nm, or 0.5 to 2 nm). Other example materials for dielectric liner 224 include aluminum oxide, silicon nitride, silicon oxynitride, aluminum nitride, silicon carbide, silicon oxide, hafnium zirconium oxide, or zirconium oxide. A dielectric fill 226 may be formed within any remaining volume between adjacent islands of TFT layers 220 and over dielectric liner 224. Dielectric fill 226 may include any suitable dielectric material such as silicon oxide, or any other dielectric material used on any of the other interconnect layers. According to some embodiments, both dielectric liner 224 and dielectric fill 226 are deposited over the whole structure and then polished back using, for example, CMP to expose a top surface of dielectric layer(s) 216.

According to some embodiments, dielectric liner 224 is also formed within divot 222 to protect the exposed surface of semiconductor region 214. In some embodiments, dielectric liner 224 is deposited using a conformal deposition process, such as atomic layer deposition (ALD). In some embodiments, dielectric liner 224 extends inwards towards a midpoint of semiconductor region 214 at the lateral edges of semiconductor region 214. For example, the formation of dielectric liner 224 within divot 222 can form a pinched-in structure 228 at the location of the lateral recess. In this manner, at least a portion of dielectric liner 224 is between passivation layer 216 and gate dielectric 212 within divot 222. So, assuming the overall structure is oriented as shown, the portion of dielectric liner 224 within divot 222 is above and over gate dielectric 212 and below and under passivation layer 216. The exact size and form of pinched-in structure 228 may vary from one embodiment to the next, depend on factors such as the deposition process for dielectric liner 224 and the process parameters, as well as thicknesses of the semiconductor region 214 and dielectric liner 224.

Figure 2H:
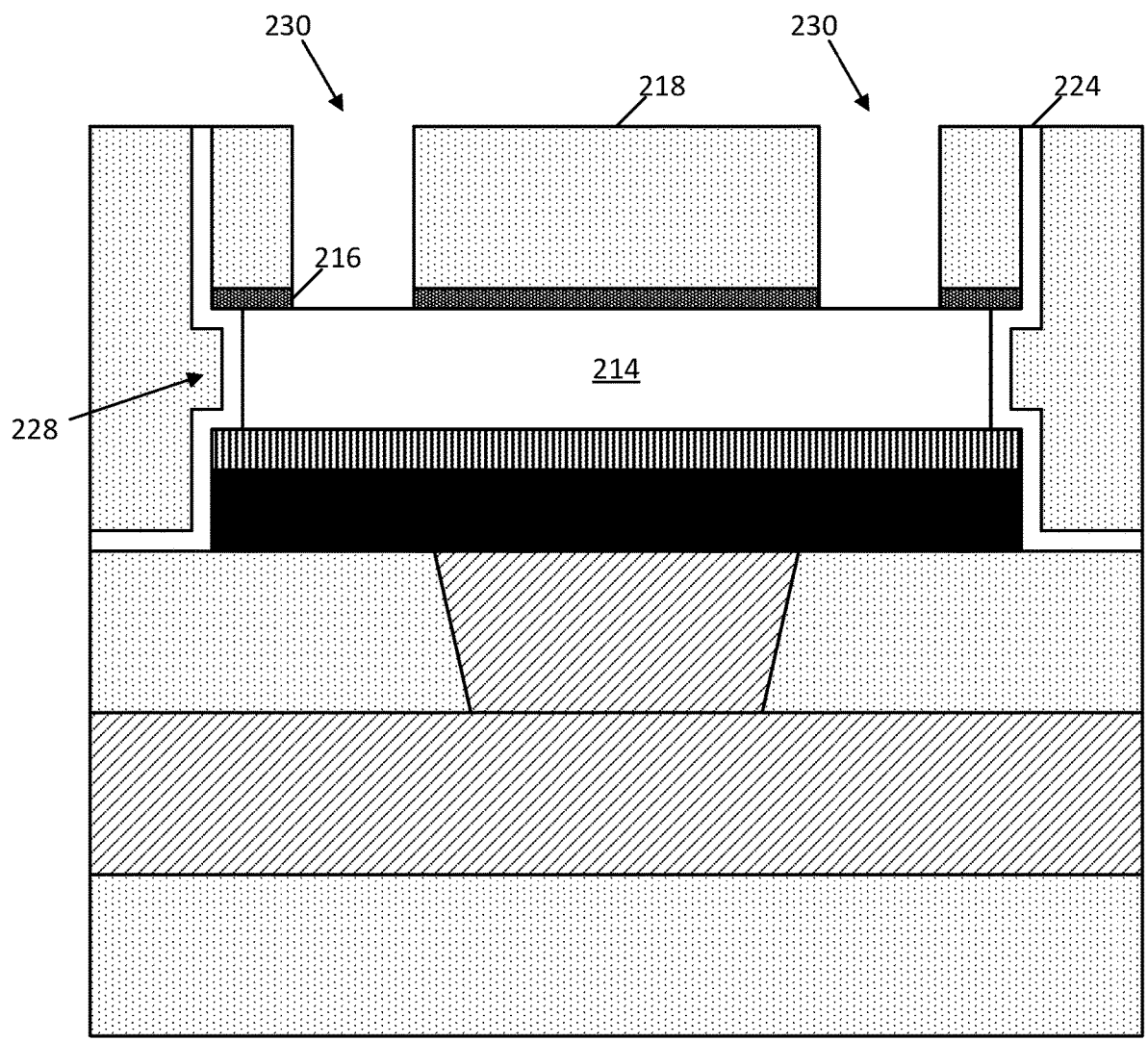
Figure 2H:
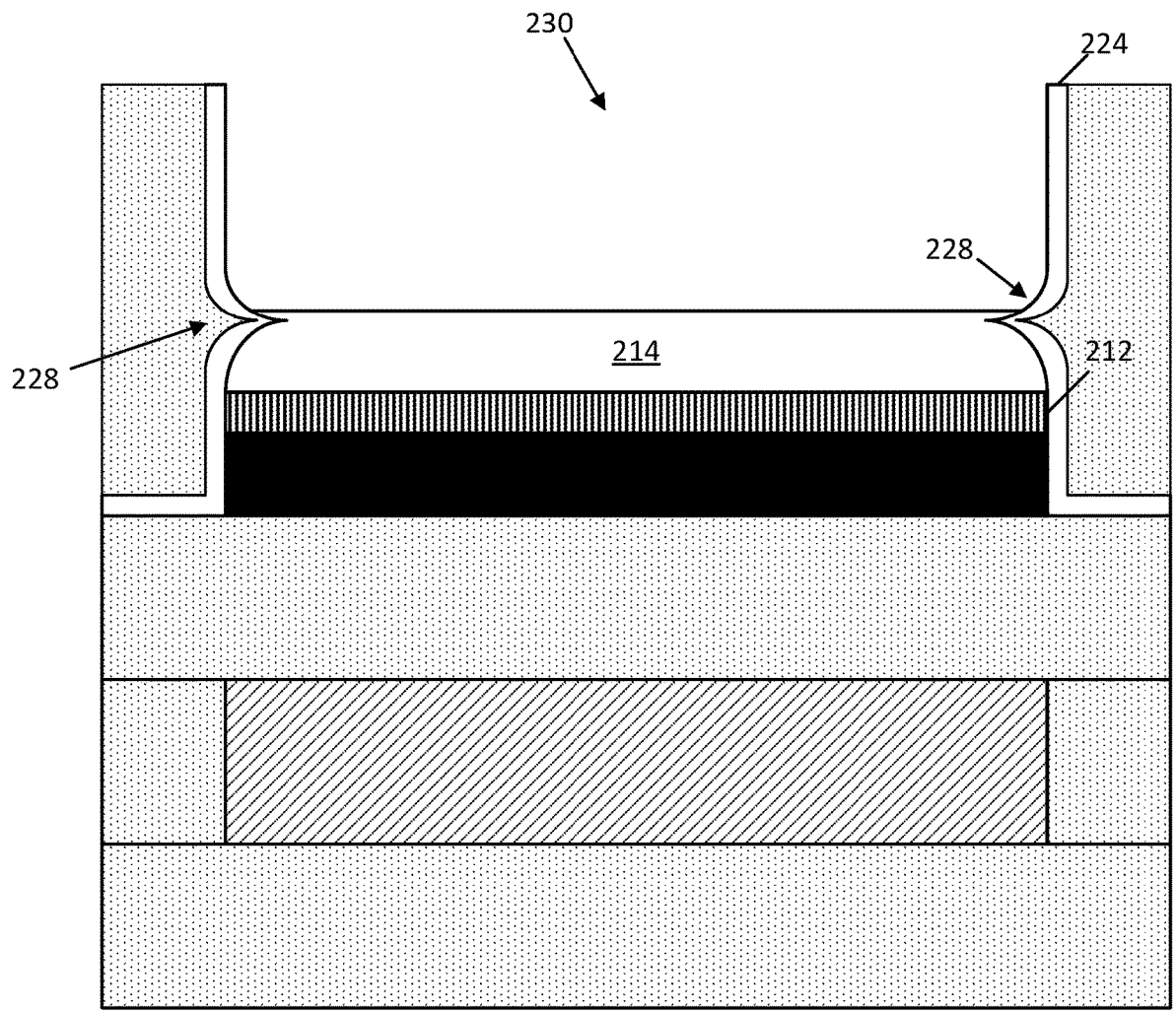

FIG. 2H is a cross-sectional view of the structure depicted in FIG. 2G following the formation of one or more contact recesses 230. According to one example, an anisotropic etching process may be performed through a thickness of at least dielectric layer(s) 218 and passivation layer 216 to expose at least a portion of a top surface of semiconductor region 214. Although recesses 230 are illustrated with straight walls, it should be understood that the etching process may yield inwardly tapered sidewalls. Recesses 230 may extend out to the edges of the TFT layers in the orthogonal direction (e.g., into and out of the page). FIG. 2H" is a cross-section view of one of the contact recesses 230 taken across the longer dimension of the contact recess 230 (i.e., orthogonal to the view illustrated in FIG. 2H). According to some embodiments, recess 230 extends out to dielectric liner 224 and also exposes at least a portion of the pinched-in structure 228 of dielectric liner 224. As discussed above, pinched-in structure 228 represents one example structure, but any part of dielectric liner 224 extending inwards towards a recessed portion of semiconductor region 214, or towards a midpoint of the semiconductor region 214, could also be used. As can be seen between each of FIG. 2H and FIG. 2H", dielectric liner 224 (and its pinched-in structure 228) extends around an entire perimeter of the TFT layers 220 (e.g., along all sidewalls of gate electrode 210, gate dielectric 212, and semiconductor region 214. So, in corresponding top down cross-sectional views, the liner 224 may go all the way around the perimeter of each of layers 210, 212 and 214, so as to provide a ring-like feature that wraps around each island of TFT layers 220.

According to some embodiments, the presence of pinched-in structure 228 also acts as an etch stop to prevent undesirable deep etching along the edge of semiconductor region 214. This etching into semiconductor region 214 may occur as the edge portions of semiconductor region 214 can become damaged during the deep etching process used to form the various TFT islands (e.g., the process illustrated in FIG. 2E).

Figure 2I:
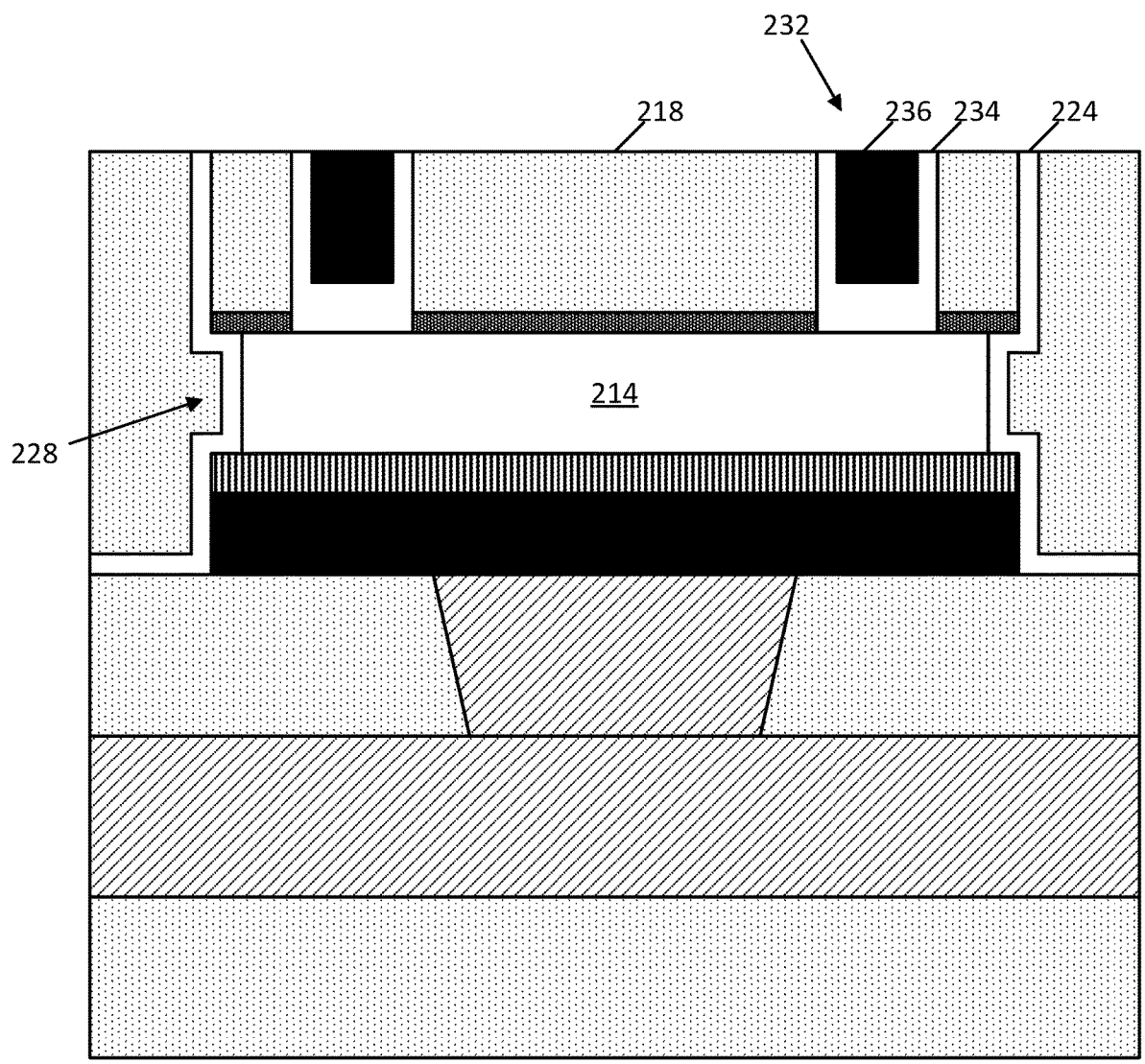
Figure 2I:
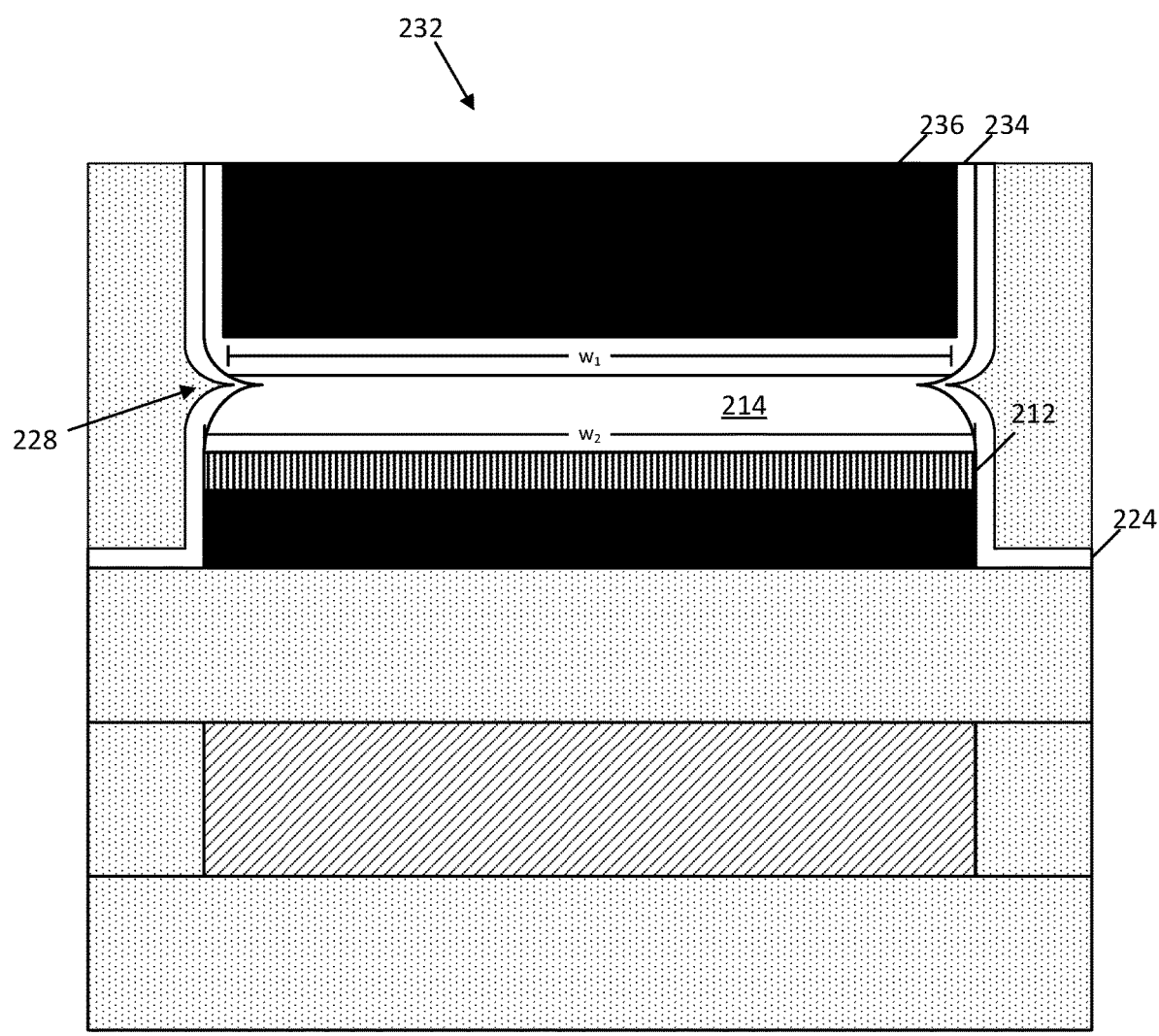

FIG. 2I is a cross-sectional view of the structure depicted in FIG. 2H following the formation of contacts 232 within contact recesses 230. According to some embodiments, contact 232 includes contact semiconductor layer(s) 234 and a metal fill 236. Contact semiconductor layer(s) 234 represent any number of formed semiconductor layers within recess 230, similar to semiconductor region 214. Accordingly, contact semiconductor layer(s) 234 may include silicon or any III-V or II-VI materials exhibiting semiconducting qualities. According to some embodiments, contact semiconductor layer(s) 234 includes metal oxide semiconductor material such as indium gallium zinc oxide (InGaZnO), indium zinc oxide (InZnO), indium oxide (InO), or gallium zinc oxide (GaZnO), to name a few examples. Like semiconductor region 210, contact semiconductor layer(s) 234 may include multiple formed semiconductor layers having varying properties to provide, for example, low contact resistance with semiconductor region 214, and a smoother energy bandgap transition with metal fill 236. According to some embodiments, contact semiconductor layer(s) 234 form along sidewalls of recess 230 and along a bottom surface of recess 230. The portion of contact semiconductor layer(s) 234 along the bottom surface of recess 230 may be thicker than the portion of contact semiconductor layer(s) 234 along sidewalls of recess 230.

Metal fill 236 may be any suitable interconnect contact metal, such as copper, ruthenium, tungsten, cobalt, molybdenum, titanium, tantalum, and alloys thereof. In some cases, metal fill 236 may be formed, for instance, using electroplating within the remaining volume of recess 230 following the formation of contact semiconductor layer(s) 234. Once both contact semiconductor layer(s) 234 and metal fill 236 have been formed within recess 230, they may both be polished back using, for example, CMP, to expose a top surface of dielectric layer(s) 218. Note that the proximity of contacts 232 to the pinched-in structure 228 can vary from one embodiment to the next and depends on factors such as the full length of the resulting island of TFT layers 228, the final length of the semiconductor region 214, and the thicknesses of the dielectric liner 224 and semiconductor region 214. In some examples a given contact 232 is in the range of 0 nm to 25 nm from the liner 224 (e.g., within 20 nm of dielectric liner 224, or within 15 nm, or within 10 nm, or within 5 nm, or within 2.5 nm, or within 1 nm, or 0 nm in the case where the given contact 232 also partially lands on, or is otherwise touching, dielectric liner 224). So, while in this example the contacts 232 are not touching dielectric liner 224, in other embodiments one or both contacts 232 may be partially landed on or otherwise touching dielectric liner 224.

FIG. 2I' is a cross-section view of one of the contacts 232 taken across the longer dimension of the contact 232 (i.e., orthogonal to the view illustrated in FIG. 2I). Contact 232 is formed on a top surface of semiconductor region 214 and also on at least a portion of the pinched-in structures of dielectric liner 224. As contact 232 rests upon the pinched-in structures from dielectric liner 224, a bottom surface of contact 232 has a width $w_1$ that is less than a width $w_2$ of a bottom surface of semiconductor region 214. In some embodiments, the difference between $w_1$ and $w_2$ is between about 1 nm and about 5 nm. Since dielectric liner 224 interrupts the width of the bottom surface of contact 232, the total capacitance between contact 232 and gate electrode 210 is decreased. In some embodiments, only portions of contact semiconductor layer(s) 234 rests upon the pinched-in structures of dielectric liner 224. In some embodiments, at least a portion of metal fill 236 rests upon the pinched-in structures of dielectric liner 224. As discussed above, the pinched-in structures represent one example structure, but any part of dielectric liner 224 extending inwards towards a recessed portion of semiconductor region 214, or otherwise extends inwards towards a midpoint of the semiconductor region 214, could also be used.

Figure 2J:
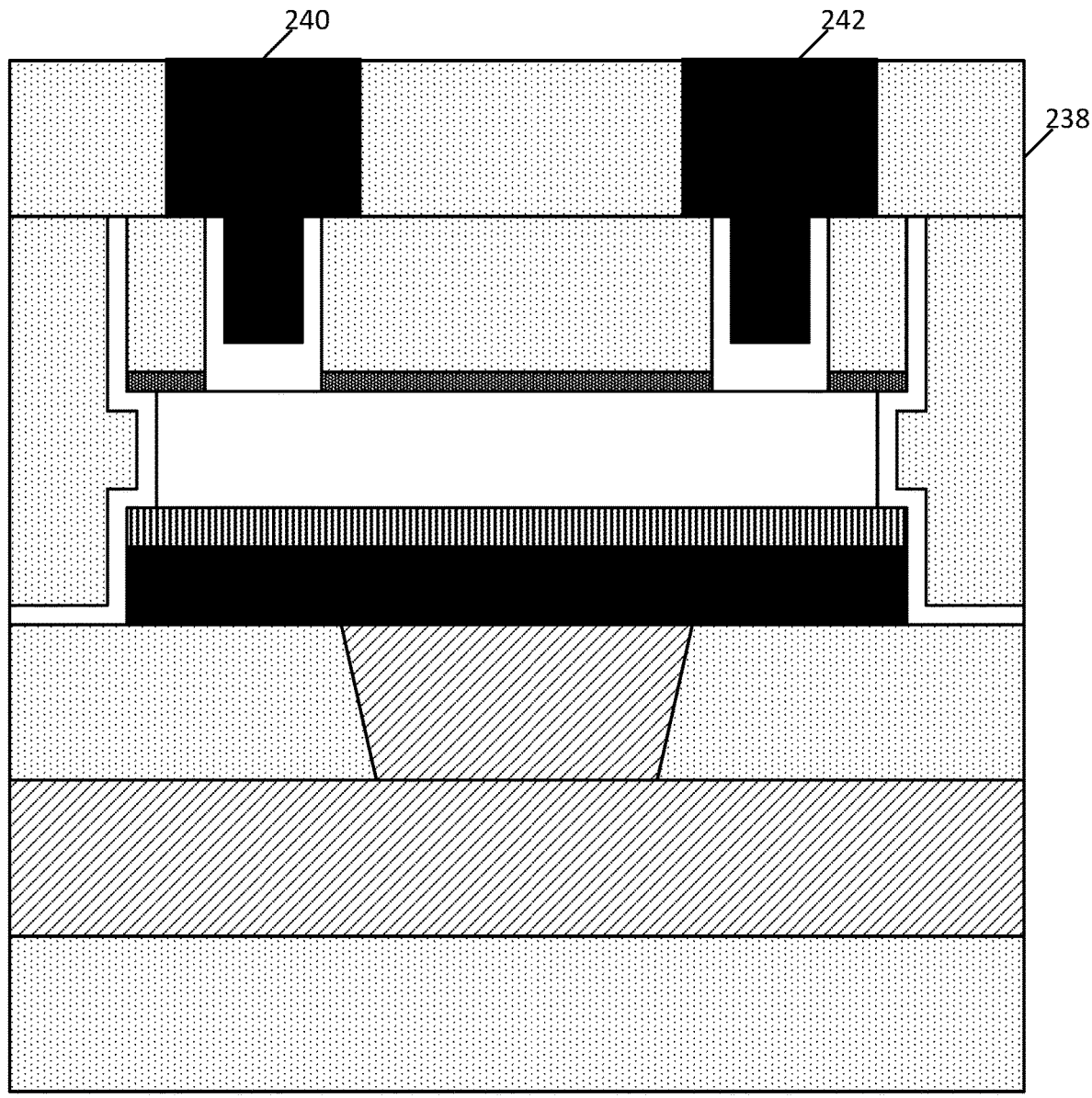

FIG. 2J is a cross-sectional view of the structure depicted in FIG. 2I following the formation of another interconnect layer 238 over the TFT structure. Interconnect layer 238 formed over the TFT structure includes a second conductive trace 240, a conductive via 242, and dielectric material surrounding the conductive features. The surrounding dielectric material may be similar to any other dielectric material (e.g., silicon dioxide or porous silicon dioxide) found in any of the other interconnect layers (such as dielectric material 112).

Second conductive trace 240 may be formed, for example, by first forming a recess within the surrounding dielectric material followed by filling the recess with a conductive material, such as copper, that is deposited using any one of electroplating, electroless plating, CVD, or PECVD, to name a few examples. After deposition of the conductive material within the recess, a polishing process may be performed using, for example, CMP to planarize a top surface of second conductive trace 240 with the surrounding dielectric material. In some embodiments, a thin barrier layer is conformally deposited (e.g., via ALD or CVD) first along the inner surfaces of the recess prior to the deposition of the remaining conductive material. The thin barrier layer may include, for example, tantalum or titanium, or a nitride of these. As discussed above, second conductive trace 240 may be one bitline of a plurality of parallel bitlines formed in the interconnect layer over the TFT structure. Accordingly, second conductive trace 240 may run into and out of the page orthogonally to first conductive trace 204. Second conductive trace 240 conductively contacts one of the contacts of the illustrated TFT structure and further contacts at least one of the contacts of other TFT structures along a row extending into and out of the page, according to some embodiments. Conductive via 242 may be conductively coupled only to one or more contacts of the illustrated TFT structure (and not coupled to any contacts of any other TFT structures). Conductive via 242 may include the same material composition and deposition process as second conductive trace 240.

Figure 2K:
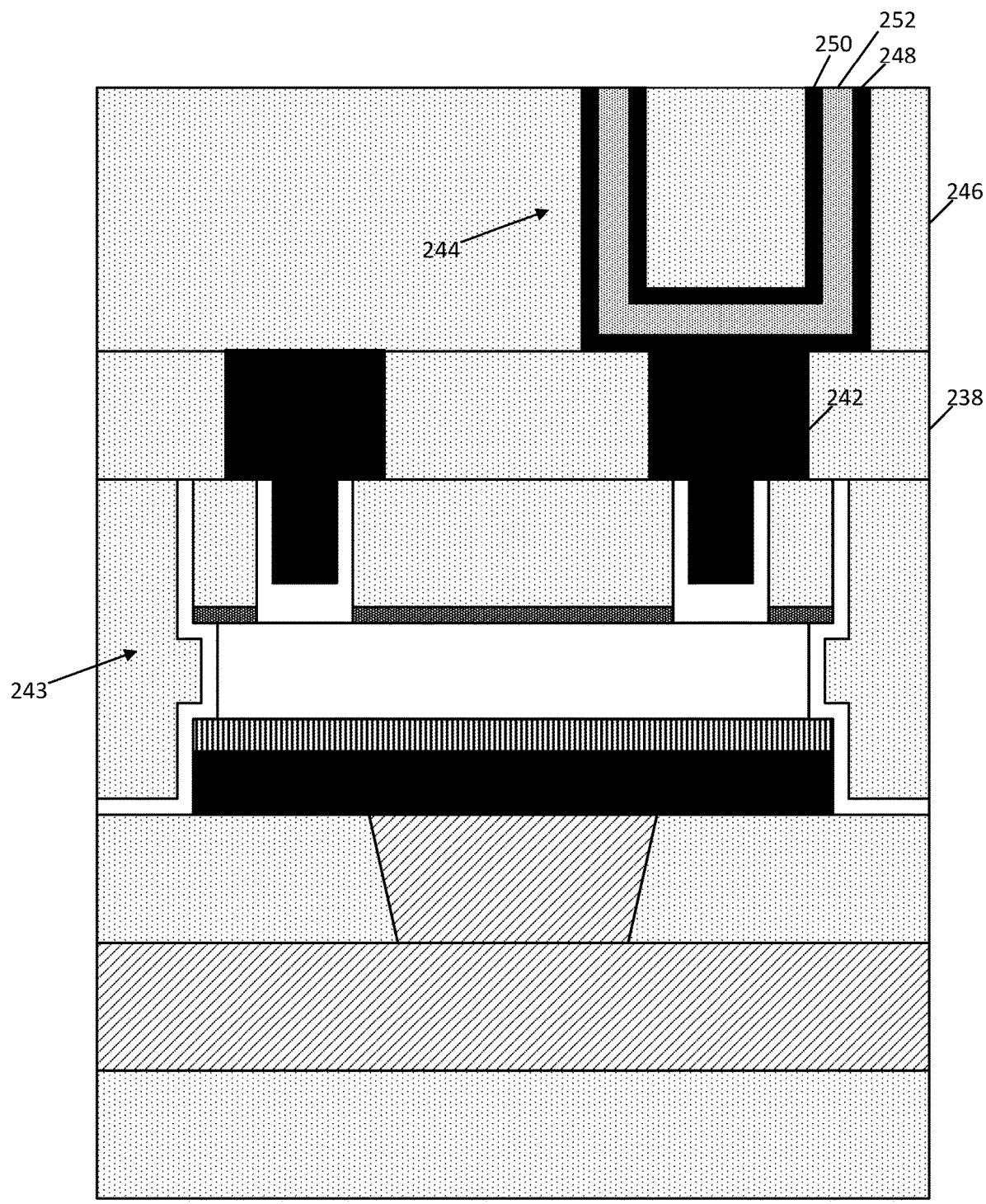

FIG. 2K is a cross-sectional view of the structure depicted in FIG. 2J following the formation of a capacitor 244 coupled to conductive via 242. As previously discussed, the TFT structure 243 is coupled to a corresponding capacitor 244 within another interconnect layer 246, and TFT structure 243 and capacitor 244, in combination, form or are part of a single TFT memory structure (e.g., an eDRAM cell).

In the TFT memory structure, capacitor 244 stores a bit of information and TFT structure 233 allows for writing and reading that bit. For example, capacitor 244 can either be charged to a first state or discharged to a second state, and these two states represent two bit values of 0 or 1. As illustrated in FIG. 2K, capacitor 244 comprises a first electrode 248 and a second electrode 250. Electrodes 248 and 250 may be formed in a 'U' shape as illustrated to provide a high opposing surface area between the electrodes. In other embodiments, capacitor 244 may have a different shape or configuration. For instance, rather than being U-shaped, capacitor 244 may have a relatively flat configuration with upper and lower electrodes, or a pillar-shaped configuration with inner and outer electrodes. In one embodiment, electrodes 248 and 250 may include any suitable electrically conductive material, such as a metal or metal alloy material including, e.g., copper, silver, aluminum, tantalum, aluminum, tungsten, nickel, platinum, molybdenum, manganese, or an alloy thereof, such as titanium nitride, tantalum nitride, titanium aluminum nitride, molybdenum oxide, manganese oxide, ruthenium, tungsten oxide, or another appropriate conductive material.

According to some embodiments, one or more dielectric layers 252 are formed on electrode 248, prior to the formation of electrode 250. One or more dielectric layers 252 include any suitable dielectric material and form the "I" part of the MIM (metal-insulator-metal) capacitor 244. Note that one or more dielectric layers 252 may include one or more distinct and/or compositionally different layers of dielectric material. For example, one or more dielectric layers 252 may include one or more thin films of one or more metal oxides, such as one or more oxides of hafnium, aluminum, zirconium, titanium, tantalum, or another appropriate metal.

Figure 3:
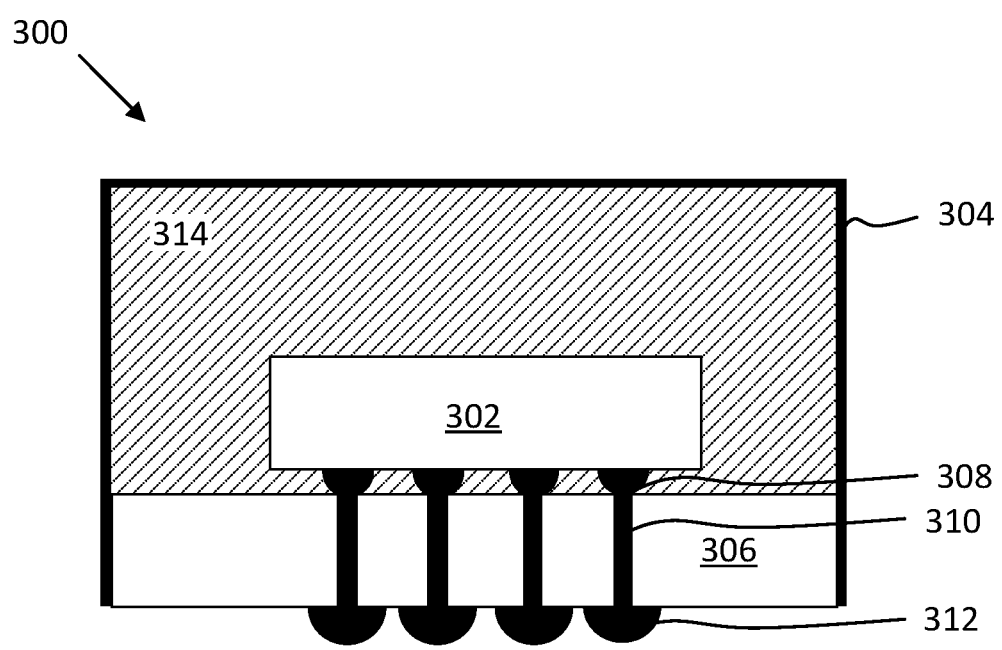
FIG. 3 illustrates a cross-section view of a chip package containing one or more semiconductor dies, in accordance with some embodiments of the present disclosure.

FIG. 3 illustrates an example embodiment of a chip package 300, in accordance with an embodiment of the present disclosure. As can be seen, chip package 300 includes one or more dies 302. One or more dies 302 may include at least one integrated circuit having a structure as described in any of the aforementioned embodiments. One or more dies 302 may include any other circuitry used to interface with other devices formed on the dies, or other devices connected to chip package 300, in some example configurations.

As can be further seen, chip package 300 includes a housing 304 that is bonded to a package substrate 306. The housing 304 may be any standard or proprietary housing, and may provide, for example, electromagnetic shielding and environmental protection for the components of chip package 300. The one or more dies 302 may be conductively coupled to a package substrate 306 using connections 308, which may be implemented with any number of standard or proprietary connection mechanisms, such as solder bumps, ball grid array (BGA), pins, or wire bonds, to name a few examples. Package substrate 306 may be any standard or proprietary package substrate, but in some cases includes a dielectric material having conductive pathways (e.g., including conductive vias and lines) extending through the dielectric material between the faces of package substrate 306, or between different locations on each face. In some embodiments, package substrate 306 may have a thickness less than 1 millimeter (e.g., between 0.1 millimeters and 0.5 millimeters), although any number of package geometries can be used. Additional conductive contacts 312 may be disposed at an opposite face of package substrate 306 for conductively contacting, for instance, a printed circuit board (PCB). One or more vias 310 extend through a thickness of package substrate 306 to provide conductive pathways between one or more of connections 308 to one or more of contacts 312. Vias 310 are illustrated as single straight columns through package substrate 306 for ease of illustration, although other configurations can be used (e.g., damascene, dual damascene, through-silicon via, or an interconnect structure that meanders through the thickness of substrate 306 to contact one or more intermediate locations therein). In still other embodiments, vias 310 are fabricated by multiple smaller stacked vias, or are staggered at different locations across package substrate 306. In the illustrated embodiment, contacts 312 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 312, to inhibit shorting.

In some embodiments, a mold material 314 may be disposed around the one or more dies 302 included within housing 304 (e.g., between dies 302 and package substrate 306 as an underfill material, as well as between dies 302 and housing 304 as an overfill material). Although the dimensions and qualities of the mold material 314 can vary from one embodiment to the next, in some embodiments, a thickness of mold material 314 is less than 1 millimeter. Example materials that may be used for mold material 314 include epoxy mold materials, as suitable. In some cases, the mold material 314 is thermally conductive, in addition to being electrically insulating.

Methodology

Figure 4:
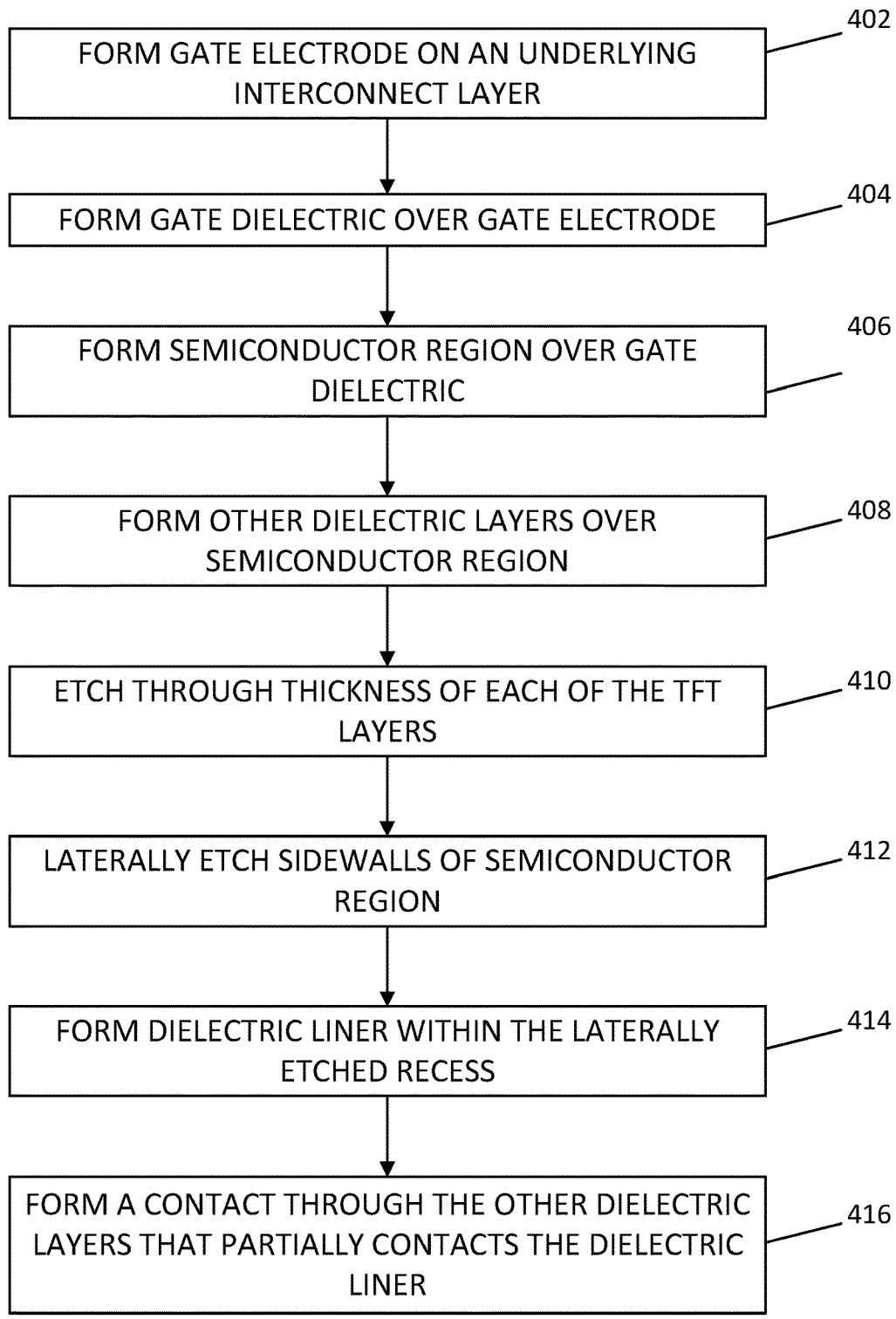
FIG. 4 is a flowchart of a method for forming a TFT-based memory structure having an indented sidewall feature, in accordance with an embodiment of the present disclosure.

FIG. 4 is a flow chart of a method 400 for forming at least a portion of an integrated circuit, according to an embodiment. Various operations of method 400 may be illustrated in FIGS. 2A-2K. However, the correlation of the various operations of method 400 to the specific components illustrated in the aforementioned figures is not intended to imply any structural and/or use limitations. Rather, the aforementioned figures provide one example embodiment of method 400. Other operations may be performed before, during, or after any of the operations of method 400. Some of the operations of method 400 may be performed in a different order than the illustrated order. In some embodiments, the various operations of method 400 are performed during back end-of-the-line (BEOL) processing.

Method 400 begins with operation 402 where a gate electrode is formed on an underlying interconnect layer within an interconnect region. According to some embodiments, the gate electrode is formed directly on an underlying conductive via while in other embodiments the gate electrode is formed directly on an underlying conductive trace (e.g., a wordline). The gate electrode may include any suitable conductive material such as polysilicon, a metal, or a metal alloy. Example suitable metals or metal alloys include aluminum, tungsten, cobalt, molybdenum, ruthenium, titanium, tantalum, copper, and carbides and nitrides thereof. The gate electrode may contain multiple layers, such as an inner plug or fill metal, with surrounding or outer work function material. According to some embodiments, the gate electrode includes one or more n-type work function metals such as platinum, gold, palladium, or cobalt. In some embodiments, the gate electrode includes one or more p-type work function metals such as titanium, titanium nitride, tantalum, or tantalum nitride. The gate electrode may be deposited any suitable deposition technique, such as CVD, PVD, electroplating, or electroless plating.

Method 400 continues with operation 404 where a gate dielectric is formed over the gate electrode. The gate dielectric may be deposited, for example, to a thickness between about 2 nm and about 10. The gate dielectric may include any suitable dielectric material (such as silicon dioxide, and/or a high-k dielectric material) and deposited using any suitable deposition process, such as CVD, ALD, flowable CVD, or spin-on dielectric. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, and lead scandium tantalum oxide. In some cases, the gate dielectric may include multiple different layers, such as a first layer of high-k material (e.g., hafnium oxide) on the gate electrode and at least one other layer of lower-k oxide between the first layer and the semiconductor region that is ultimately formed over the gate dielectric.

Method 400 continues with operation 406 where a semiconductor region is formed over the gate dielectric. The semiconductor region may include any suitable semiconductor material, such as silicon or any III-V or II-VI materials exhibiting semiconducting qualities. Semiconductor region 214 may be deposited to a thickness between about 4 nm and about 16 nm using any suitable deposition technique, such as CVD, PECVD, or epitaxial growth, to name a few examples. According to some embodiments, the semiconductor region includes a plurality of deposited semiconductor layers with each layer having a different material composition and/or doping profile.

Method 400 continues with operation 408 where other dielectric layers are formed over the semiconductor region. According to some embodiments, the other dielectric layers include a passivation layer having a dielectric material that protects the underlying semiconductor region. The passivation layer may include, for example, aluminum oxide, although other metal oxides may be used as well. Any number of passivation and/or interlayer dielectrics (ILD) can be deposited over the passivation layer. According to some embodiments, any of the other dielectric layers may include silicon oxide, silicon oxycarbide, silicon nitride, or silicon oxynitride, to name a few examples.

Method 400 continues with operation 410 where an etch is performed through a thickness of the various TFT layers. According to some embodiments, an entire thickness of each of the gate electrode, gate dielectric, semiconductor region, and the other dielectric layers is etched through to form islands of TFT layers. Each island of TFT layers will ultimately become a distinct memory cell, according to some embodiments. In some embodiments, an anisotropic etching process stops at a top surface of an underlying dielectric layer (e.g., beneath the gate electrode) or may stop after etching through a portion of the underlying dielectric layer. According to some embodiments, the total etch depth at least cuts through an entire thickness of the gate electrode. The full length of the resulting island of TFT layers can vary from one embodiment to the next, but in some examples may be between about 50 nm and about 250 nm.

Method 400 continues with operation 412 where the exposed sidewalls of the semiconductor region are laterally etched. An isotropic etching process using either wet chemical etchants or dry plasma may be used to selectively remove the exposed portions of the semiconductor region to form a lateral recess, while simultaneously removing none of (or very little of) the surrounding dielectric and/or metal materials. The etching process may form a divot or other similar type of recess into the side of the semiconductor region. In some embodiments, the divot extends laterally into the semiconductor region between about 0.5 nm and about 15 nm (e.g., 0.5 to 10 nm, or 0.5 to 7.5 nm, or 0.5 to 5 nm, or 0.5 to 2.5 nm).

Method 400 continues with operation 414 where a dielectric liner is formed within the lateral recess in the semiconductor region. According to some embodiments, the dielectric liner is formed over the exposed sidewalls of each of the TFT layers (e.g., the gate electrode, gate dielectric, semiconductor region, and other dielectric layers). The dielectric liner may be a high-k material, such as hafnium oxide, with a thickness between about 0.5 nm and 5 nm (e.g., 0.5 to 4 nm, or 0.5 to 3 nm, or 0.5 to 2 nm, or 0.5 to 1 nm). The dielectric liner may be deposited using a conformal deposition technique (such as ALD), such that the dielectric liner also forms within the lateral recess in the semiconductor region. In some embodiments, the dielectric liner within the lateral recess creates a pinched-in structure. The exact size and form of the pinched-in structure may depend, for instance, on the deposition process for the dielectric liner and the process parameters (e.g., dwell time of isotropic etch to recess the semiconductor region), as well as the thicknesses of the semiconductor (channel) region and the dielectric liner itself and the full length of the resulting island of TFT layers, according to some examples.

Method 400 continues with operation 416 where a conductive contact is formed through the other dielectric layers, such that at least a portion of the conductive contact lands upon semiconductor region proximate to the pinched-in structure (or any other type of laterally recessed structure) of the dielectric liner. The proximity of the conductive contact to the pinched-in structure can vary from one embodiment to the next and depends on factors such as the full length of the resulting island of TFT layers, the final length of the semiconductor region, and the thickness of the liner, but in some examples is in the range of 0 nm to 25 nm (e.g., within 20 nm of liner, or within 15 nm, or within 10 nm, or within 5 nm, or within 2.5 nm, or within 1 nm, or 0 nm in the case where the conductive contact also lands on, or is otherwise touching, the liner). As discussed above, the conductive contact may include one or more contact semiconductor layers and a metal fill. As edge portions of the conductive contact rest upon the pinched-in structures from the dielectric liner, a bottom surface of the contact has a width that is less than a width of a bottom surface of the semiconductor region. Since the pinched-in portions of the dielectric liner interrupt the width of the bottom surface of the conductive contact, the total capacitance between the conductive contact and the gate electrode is decreased (e.g., due to a decrease in the total area between the capacitor electrodes).

Example System

Figure 5:
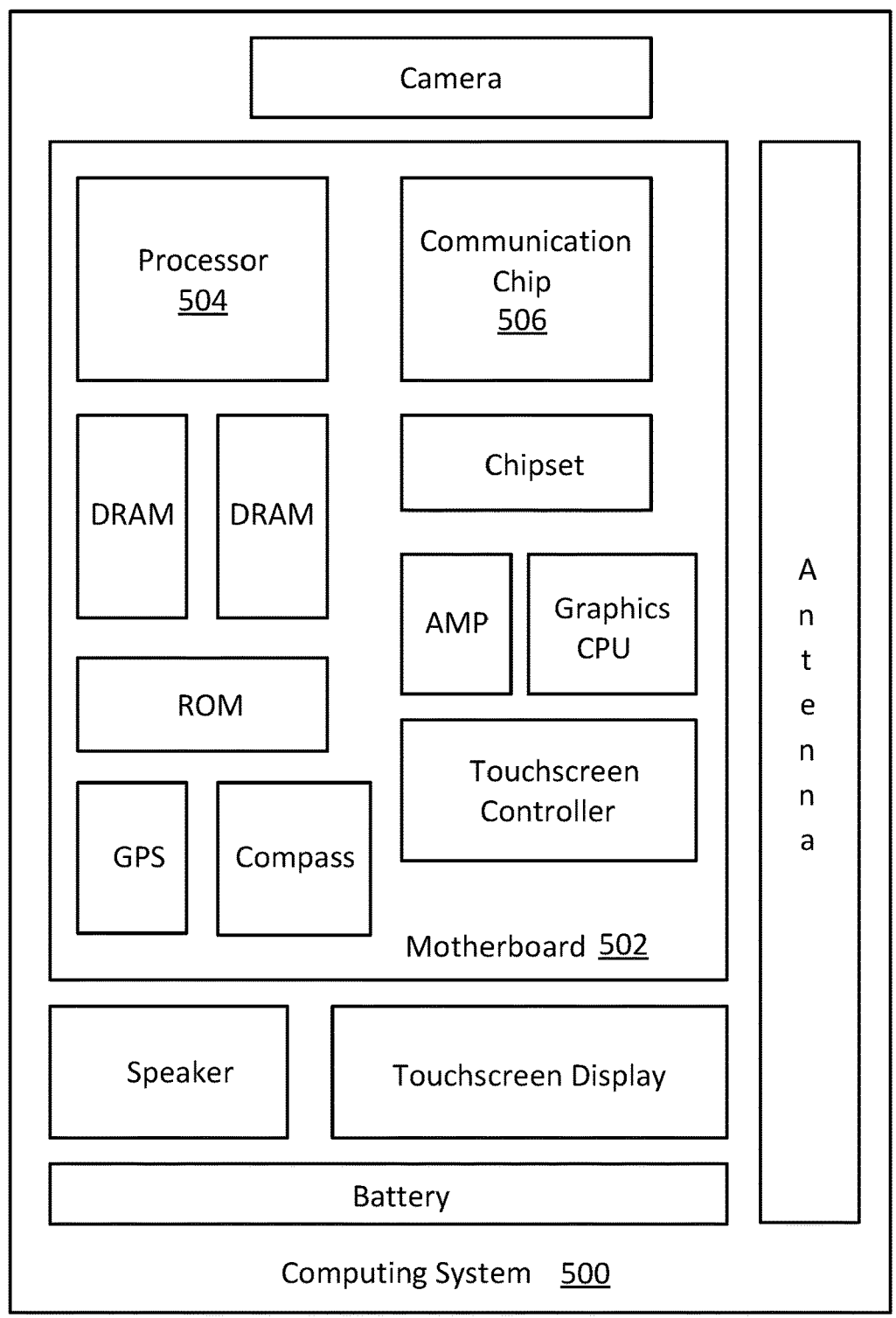
FIG. 5 illustrates a computing system including one or more integrated circuits, as variously described herein, in accordance with an embodiment of the present disclosure.

FIG. 5 is an example computing system implemented with one or more of the integrated circuit structures as disclosed herein, in accordance with some embodiments of the present disclosure. As can be seen, the computing system 500 houses a motherboard 502. The motherboard 502 may include a number of components, including, but not limited to, a processor 504 and at least one communication chip 506, each of which can be physically and electrically coupled to the motherboard 502, or otherwise integrated therein. As will be appreciated, the motherboard 502 may be, for example, any printed circuit board (PCB), whether a main board, a daughterboard mounted on a main board, or the only board of system 500, etc.

Depending on its applications, computing system 500 may include one or more other components that may or may not be physically and electrically coupled to the motherboard 502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 500 may include one or more integrated circuit structures or devices configured in accordance with an example embodiment (e.g., a module including an integrated circuit having interconnect structures that include tiers of backend memory cells having pinched-in dielectric liners to reduce parasitic capacitance). In some embodiments, the inclusion of the backend memory cells may reduce the number of other DRAM chips included within computing system 500. In some embodiments, multiple functions can be integrated into one or more chips (e.g., for instance, note that the communication chip 506 can be part of or otherwise integrated into the processor 504).

The communication chip 506 enables wireless communications for the transfer of data to and from the computing system 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing system 500 includes an integrated circuit die packaged within the processor 504. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 506 also may include an integrated circuit die packaged within the communication chip 506. In accordance with some such example embodiments, the integrated circuit die of the communication chip includes one or more semiconductor devices as variously described herein. As will be appreciated in light of this disclosure, note that multi-standard wireless capability may be integrated directly into the processor 504 (e.g., where functionality of any chips 506 is integrated into processor 504, rather than having separate communication chips). Further note that processor 504 may be a chip set having such wireless capability. In short, any number of processor 504 and/or communication chips 506 can be used. Likewise, any one chip or chip set can have multiple functions integrated therein.

In various implementations, the computing system 500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 500 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a gate electrode, a gate dielectric on the gate electrode, a semiconductor region on the gate dielectric, a conductive contact that contacts at least a portion of the semiconductor region, and a dielectric liner that extends along a sidewall of at least the gate electrode, the gate dielectric, and the semiconductor region. A portion of the dielectric liner on the sidewall of the semiconductor region extends inwards towards a midpoint of the semiconductor region. In this manner, the dielectric liner is described as pinching inwards, as can be seen in a cross-sectional profile.

Example 2 includes the subject matter of Example 1, further comprising a passivation layer over the semiconductor region, such that the conductive contact extends through an entire thickness of the passivation layer.

Example 3 includes the subject matter of Example 2, wherein the passivation layer comprises aluminum and oxygen.

Example 4 includes the subject matter of any one of Examples 1-3, wherein the conductive contact is a first conductive contact, the integrated circuit further comprising a second conductive contact that contacts at least a portion of the semiconductor region.

Example 5 includes the subject matter of any one of Examples 1-4, wherein the dielectric liner extends around a perimeter of each of the gate electrode, the gate dielectric, and the semiconductor region.

Example 6 includes the subject matter of any one of Examples 1-5, further comprising one or more dielectric layers on the semiconductor region, wherein the dielectric liner further extends along a sidewall of the one or more dielectric layers.

Example 7 includes the subject matter of any one of Examples 1-6, wherein the dielectric liner comprises hafnium and oxygen.

Example 8 includes the subject matter of any one of Examples 1-7, wherein at least a portion of the conductive contact is partially on or otherwise touching the dielectric liner where the dielectric liner extends inwards.

Example 9 includes the subject matter of any one of Examples 1-8, wherein a width of a bottom surface of the semiconductor region is greater than a width of a bottom surface of the conductive contact.

Example 10 includes the subject matter of any one of Examples 1-9, wherein the semiconductor region comprises oxygen, indium, gallium, and zinc.

Example 11 includes the subject matter of any one of Examples 1-10, wherein each of the gate electrode, the gate dielectric, the semiconductor region on the gate dielectric, the conductive contact, and the dielectric liner structure is part of a transistor structure that is part of an array of transistor structures within an interconnect structure.

Example 12 is a printed circuit board including the integrated circuit of any one of Examples 1-11.

Example 13 is an integrated circuit that includes a plurality of semiconductor devices, an interconnect structure above the plurality of semiconductor devices and including a plurality of interconnect layers, and a thin film transistor (TFT) structure within an interconnect layer of the plurality of stacked interconnect layers. The TFT structure includes a gate electrode, a gate dielectric on the gate electrode, a semiconductor region on the gate dielectric, a conductive contact that contacts at least a portion of the semiconductor region, and a dielectric liner that extends along a sidewall of at least the gate electrode, the gate dielectric, and the semiconductor region. A portion of the dielectric liner on the sidewall of the semiconductor region laterally extends towards a midpoint of the semiconductor region.

Example 14 includes the subject matter of Example 13, further comprising a passivation layer over the semiconductor region, such that the conductive contact extends through an entire thickness of the passivation layer.

Example 15 includes the subject matter of Example 14, wherein the passivation layer comprises aluminum and oxygen.

Example 16 includes the subject matter of any one of Examples 13-15, wherein the conductive contact is a first conductive contact, the integrated circuit further comprising a second conductive contact that contacts at least a portion of the semiconductor region.

Example 17 includes the subject matter of any one of Examples 13-16, wherein the dielectric liner extends around a perimeter of each of the gate electrode, the gate dielectric, and the semiconductor region.

Example 18 includes the subject matter of any one of Examples 13-17, further comprising one or more dielectric layers on the semiconductor region, wherein the dielectric liner further extends along a sidewall of the one or more dielectric layers.

Example 19 includes the subject matter of any one of Examples 13-18, wherein the dielectric liner comprises hafnium and oxygen.

Example 20 includes the subject matter of any one of Examples 13-19, wherein at least a portion of the conductive contact is partially on or otherwise touching the dielectric liner where the dielectric liner pinches or otherwise extends inwards.

Example 21 includes the subject matter of any one of Examples 13-20, wherein a width of a bottom surface of the semiconductor region is greater than a width of a bottom surface of the conductive contact.

Example 22 includes the subject matter of any one of Examples 13-21, wherein the semiconductor region comprises oxygen, indium, gallium, and zinc.

Example 23 includes the subject matter of any one of Examples 13-22, wherein the TFT structure is one TFT structure of an array of TFT structures within the interconnect layer.

Example 24 is a printed circuit board including the integrated circuit of any one of Examples 13-23.

Example 25 is an electronic device that includes a chip package having one or more dies. At least one of the one or more dies includes a plurality of semiconductor devices, an interconnect structure above the plurality of semiconductor devices and including a plurality of interconnect layers, and a thin film transistor (TFT) structure within an interconnect layer of the plurality of stacked interconnect layers. The TFT structure includes a gate electrode, a gate dielectric on the gate electrode, a semiconductor region on the gate dielectric, a conductive contact that contacts at least a portion of the semiconductor region, and a dielectric liner that extends along a sidewall of at least the gate electrode, the gate dielectric, and the semiconductor region. A portion of the dielectric liner on the sidewall of the semiconductor region pinches or otherwise extends inwards towards a midpoint of the semiconductor region.

Example 26 includes the subject matter of Example 25, wherein the TFT structure further comprises a passivation layer over the semiconductor region, such that the conductive contact extends through an entire thickness of the passivation layer.

Example 27 includes the subject matter of Example 26, wherein the passivation layer comprises aluminum and oxygen.

Example 28 includes the subject matter of any one of Examples 25-27, wherein the conductive contact is a first conductive contact and the TFT structure comprises a second conductive contact that contacts at least a portion of the semiconductor region.

Example 29 includes the subject matter of any one of Examples 25-28, wherein the dielectric liner extends around a perimeter of each of the gate electrode, gate dielectric, and semiconductor region.

Example 30 includes the subject matter of any one of Examples 25-29, further comprising one or more dielectric layers on the semiconductor region, wherein the dielectric liner further extends along a sidewall of the one or more dielectric layers.

Example 31 includes the subject matter of any one of Examples 25-30, wherein the dielectric liner comprises hafnium and oxygen.

Example 32 includes the subject matter of any one of Examples 25-31, wherein at least a portion of the conductive contact is partially on or otherwise touching the dielectric liner where it pinches or otherwise extends inwards.

Example 33 includes the subject matter of any one of Examples 25-32, wherein a width of a bottom surface of the semiconductor region is greater than a width of a bottom surface of the conductive contact.

Example 34 includes the subject matter of any one of Examples 25-33, wherein the semiconductor region comprises oxygen, indium, gallium, and zinc.

Example 35 includes the subject matter of any one of Examples 25-34, wherein the TFT structure is one TFT structure of an array of TFT structures within the interconnect layer.

Example 36 includes the subject matter of any one of Examples 25-35, further comprising a printed circuit board, wherein the chip package is coupled to the printed circuit board.

Example 37 is a method of forming an integrated circuit. The method includes forming a gate electrode on an underlying interconnect layer within an interconnect region over a plurality of semiconductor devices; forming a gate dielectric on the gate electrode; forming a semiconductor region on the gate dielectric; forming one or more dielectric layers over the semiconductor region; etching a first recess through a thickness of the one or more dielectric layers, the semiconductor region, the gate dielectric, and the gate electrode; laterally etching an exposed sidewall of the semiconductor region to form a lateral recess at the semiconductor region; forming a dielectric liner within the first recess and over at least the exposed sidewall of the semiconductor region, such that the dielectric liner forms within the lateral recess; etching a second recess through the one or more dielectric layers such that the second recess exposes at least a portion of a top surface of the semiconductor region; and forming a conductive contact within the second recess.

Example 38 includes the subject matter of Example 37, wherein the semiconductor region comprises oxygen, indium, gallium, and zinc.

Example 39 includes the subject matter of Example 37 or 38, wherein the underlying interconnect layer comprises a conductive layer, and wherein forming the gate electrode comprises forming the gate electrode on the conductive layer.

Example 40 includes the subject matter of any one of Examples 37-39, wherein etching the second recess comprises exposing at least a portion of the dielectric liner within the lateral recess.

Example 41 includes the subject matter of Example 40, wherein forming the conductive contact comprises forming the conductive contact on at least a portion of the portion of the dielectric liner within the lateral recess.

Example 42 includes the subject matter of Example 41, wherein the lateral recess has a funnel shape such that the portion of the dielectric liner within the lateral recess pinches or otherwise extends inwards towards the semiconductor region.

Example 43 is an integrated circuit that includes a plurality of semiconductor devices, an interconnect structure above the plurality of semiconductor devices and including a plurality of interconnect layers, and a thin film transistor (TFT) structure within an interconnect layer of the plurality of stacked interconnect layers. The TFT structure includes a gate electrode, a gate dielectric on the gate electrode, a semiconductor region on the gate dielectric and having a lateral recess along a sidewall of the semiconductor region, a dielectric liner that extends along a sidewall of at least the gate electrode, the gate dielectric, and the semiconductor region. A portion of the dielectric liner is within the lateral recess of the semiconductor region. The TFT structure also includes a conductive contact that contacts at least a portion of a top surface of the semiconductor region and at least a portion of the portion of the dielectric liner within the lateral recess.

Example 44 includes the subject matter of Example 43, wherein the TFT structure further comprises a passivation layer over the semiconductor region, such that the conductive contact extends through an entire thickness of the passivation layer.

Example 45 includes the subject matter of Example 44, wherein the passivation layer comprises aluminum and oxygen.

Example 46 includes the subject matter of any one of Examples 43-45, wherein the conductive contact is a first conductive contact and the TFT structure comprises a second conductive contact that contacts at least another portion of the top surface of the semiconductor region.

Example 47 includes the subject matter of any one of Examples 43-46, wherein the dielectric liner extends around a perimeter of each of the gate electrode, gate dielectric, and semiconductor region.

Example 48 includes the subject matter of any one of Examples 43-47, further comprising one or more dielectric layers on the semiconductor region, wherein the dielectric liner further extends along a sidewall of the one or more dielectric layers.

Example 49 includes the subject matter of any one of Examples 43-48, wherein the dielectric liner comprises hafnium and oxygen.

Example 50 includes the subject matter of any one of Examples 43-49, wherein a width of a bottom surface of the semiconductor region is greater than a width of a bottom surface of the conductive contact.

Example 51 includes the subject matter of any one of Examples 43-50, wherein the semiconductor region comprises oxygen, indium, gallium, and zinc.

Example 52 includes the subject matter of any one of Examples 43-51, wherein the TFT structure is one TFT structure of an array of TFT structures within the interconnect layer.

Example 53 is a printed circuit board that includes the integrated circuit of any one of Examples 43-52.

The foregoing description of the embodiments of the disclosure has been presented for the purposes of illustration and description. It is not intended to be exhaustive or to limit the disclosure to the precise forms disclosed. Many modifications and variations will be apparent in light of this disclosure. It is intended that the scope of the disclosure be limited not by this detailed description, but rather by the claims appended hereto.

What is claimed is:

1. An integrated circuit, comprising:
   a gate electrode;
   a gate dielectric on the gate electrode;
   a semiconductor region on the gate dielectric;
   a conductive contact that contacts at least a portion of the semiconductor region; and
   a dielectric liner that extends along a sidewall of at least the gate electrode, the gate dielectric, and the semiconductor region, wherein the portion of the dielectric liner on the sidewall of the semiconductor region extends inwards towards a midpoint of the semiconductor region.

2. The integrated circuit of claim 1, wherein the dielectric liner extends around a perimeter of each of the gate electrode, the gate dielectric, and the semiconductor region.

3. The integrated circuit of claim 1, further comprising one or more dielectric layers on the semiconductor region, wherein the dielectric liner further extends along a sidewall of the one or more dielectric layers.

4. The integrated circuit of claim 1, wherein the dielectric liner comprises hafnium and oxygen.

5. The integrated circuit of claim 1, wherein at least a portion of the conductive contact is touching the dielectric liner where the dielectric liner extends inwards.

6. The integrated circuit of claim 1, wherein a width of a bottom surface of the semiconductor region is greater than a width of a bottom surface of the conductive contact.

7. The integrated circuit of claim 1, wherein each of the gate electrode, the gate dielectric, the semiconductor region on the gate dielectric, the conductive contact, and the dielectric liner structure is part of a transistor structure that is part of an array of transistor structures within an interconnect structure.

8. A printed circuit board comprising the integrated circuit of claim 1.

9. An electronic device, comprising:
   a chip package having one or more dies, wherein at least one of the one or more dies includes
      a plurality of semiconductor devices;

an interconnect region above the plurality of semiconductor devices, the interconnect region comprising a plurality of stacked interconnect layers; and a thin film transistor (TFT) structure within an interconnect layer of the plurality of stacked interconnect layers, the TFT structure comprising
- a gate electrode,
- a gate dielectric on the gate electrode,
- a semiconductor region on the gate dielectric,
- a conductive contact that contacts at least a portion of the semiconductor region, and
- a dielectric liner that extends along a sidewall of at least the gate electrode, the gate dielectric, and the semiconductor region, wherein the portion of the dielectric liner on the sidewall of the semiconductor region laterally extends towards a midpoint of the semiconductor region.

10. The electronic device of claim 9, wherein the dielectric liner extends around a perimeter of each of the gate electrode, gate dielectric, and semiconductor region.

11. The electronic device of claim 9, wherein at least a portion of the conductive contact is partially on or otherwise touching the dielectric liner.

12. The electronic device of claim 9, wherein a width of a bottom surface of the semiconductor region is greater than a width of a bottom surface of the conductive contact.

13. The electronic device of claim 9, wherein the TFT structure is one TFT structure of an array of TFT structures within the interconnect layer.

14. The electronic device of claim 9, further comprising a printed circuit board, wherein the chip package is coupled to the printed circuit board.

15. An integrated circuit, comprising:
a plurality of semiconductor devices;
an interconnect region above the plurality of semiconductor devices, the interconnect region comprising a plurality of stacked interconnect layers; and
a thin film transistor (TFT) structure within an interconnect layer of the plurality of stacked interconnect layers, the TFT structure comprising
- a gate electrode,
- a gate dielectric on the gate electrode,
- a semiconductor region on the gate dielectric, the semiconductor region having a lateral recess along a sidewall of the semiconductor region;
- a dielectric liner that extends along a sidewall of at least the gate electrode, the gate dielectric, and the semiconductor region, such that a portion of the dielectric liner is within the lateral recess of the semiconductor region; and
- a conductive contact that contacts at least a portion of a top surface of the semiconductor region and at least a portion of the portion of the dielectric liner within the lateral recess.

16. The integrated circuit of claim 15, wherein the dielectric liner extends around a perimeter of each of the gate electrode, gate dielectric, and semiconductor region.

17. The integrated circuit of claim 15, further comprising one or more dielectric layers on the semiconductor region, wherein the dielectric liner further extends along a sidewall of the one or more dielectric layers.

18. The integrated circuit of claim 15, wherein a width of a bottom surface of the semiconductor region is greater than a width of a bottom surface of the conductive contact.

19. The integrated circuit of claim 15, wherein the TFT structure is one TFT structure of an array of TFT structures within the interconnect layer.

20. A printed circuit board comprising the integrated circuit of claim 15.

* * * * *